(12) United States Patent
Hatano

(10) Patent No.: US 10,910,424 B2
(45) Date of Patent: Feb. 2, 2021

(54) SOLID-STATE IMAGE PICKUP UNIT, METHOD OF MANUFACTURING THE SAME, AND ELECTRONIC APPARATUS

(71) Applicant: SONY SEMICONDUCTOR SOLUTIONS CORPORATION, Kanagawa (JP)

(72) Inventor: Keisuke Hatano, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 14/780,640

(22) PCT Filed: Mar. 27, 2014

(86) PCT No.: PCT/JP2014/001805
§ 371 (c)(1),
(2) Date: Sep. 28, 2015

(87) PCT Pub. No.: WO2014/162705
PCT Pub. Date: Oct. 9, 2014

(65) Prior Publication Data
US 2016/0043125 A1 Feb. 11, 2016

(30) Foreign Application Priority Data
Apr. 4, 2013 (JP) .................. 2013-078831

(51) Int. Cl.
*H01L 27/146* (2006.01)
*H01L 27/28* (2006.01)
*H01L 27/30* (2006.01)

(52) U.S. Cl.
CPC .... *H01L 27/14629* (2013.01); *H01L 27/1464* (2013.01); *H01L 27/14621* (2013.01); *H01L 27/14627* (2013.01); *H01L 27/14634* (2013.01); *H01L 27/14636* (2013.01); *H01L 27/14647* (2013.01); *H01L 27/14685* (2013.01); *H01L 27/286* (2013.01); *H01L 27/307* (2013.01)

(58) Field of Classification Search
CPC ........ H01L 27/30; H01L 27/28; H01L 27/146
USPC .............. 257/40, 436, 432; 438/72; 348/294
See application file for complete search history.

(56) References Cited

U.S. PATENT DOCUMENTS 6,621,540 B2 * 9/2003 Noritake et al. ............... 349/113
6,927,432 B2 * 8/2005 Holm et al. ................... 257/290
(Continued)

FOREIGN PATENT DOCUMENTS

JP 2008-147333 6/2008
JP 2011091128 A 5/2011

OTHER PUBLICATIONS

International Search Report prepared by the European Patent Office dated Jun. 10, 2014, for International Application No. PCT/JP2014/001805.
(Continued)

*Primary Examiner* — Sheng-Bai Zhu
(74) *Attorney, Agent, or Firm* — Sheridan Ross P.C.

(57) ABSTRACT

A solid-state image pickup unit includes: a first member including a photoelectric conversion section; and a second member including a reflective plate with a concave surface section, the second member being bonded to a surface opposite to a light incident surface of the first member to allow the concave surface section of the reflective plate to face the photoelectric conversion section.

17 Claims, 33 Drawing Sheets

(56) References Cited

U.S. PATENT DOCUMENTS

| | | | | |
|---|---|---|---|---|
| 7,425,460 B2* | 9/2008 | Pain | ................ | H01L 27/14601 |
| | | | | 257/E31.128 |
| 2007/0241376 A1* | 10/2007 | Inoue | ........................... | 257/291 |
| 2009/0050947 A1* | 2/2009 | Dungan et al. | ............... | 257/294 |
| 2010/0032659 A1* | 2/2010 | Yoshida | ......................... | 257/40 |
| 2011/0019042 A1* | 1/2011 | Yamaguchi | .................. | 348/280 |
| 2011/0090384 A1* | 4/2011 | Yamada | ........................ | 348/294 |
| 2011/0254115 A1* | 10/2011 | Shih et al. | .................... | 257/432 |
| 2013/0221465 A1* | 8/2013 | Kim | ................. | H01L 27/14636 |
| | | | | 257/432 |
| 2014/0117481 A1* | 5/2014 | Kato | ................. | H01L 27/1464 |
| | | | | 257/432 |

OTHER PUBLICATIONS

Official Action (and its English translation) for Chinese Application No. 201480004441.7 dated Jun. 2, 2017, 17 pages.

* cited by examiner

[Fig. 1]
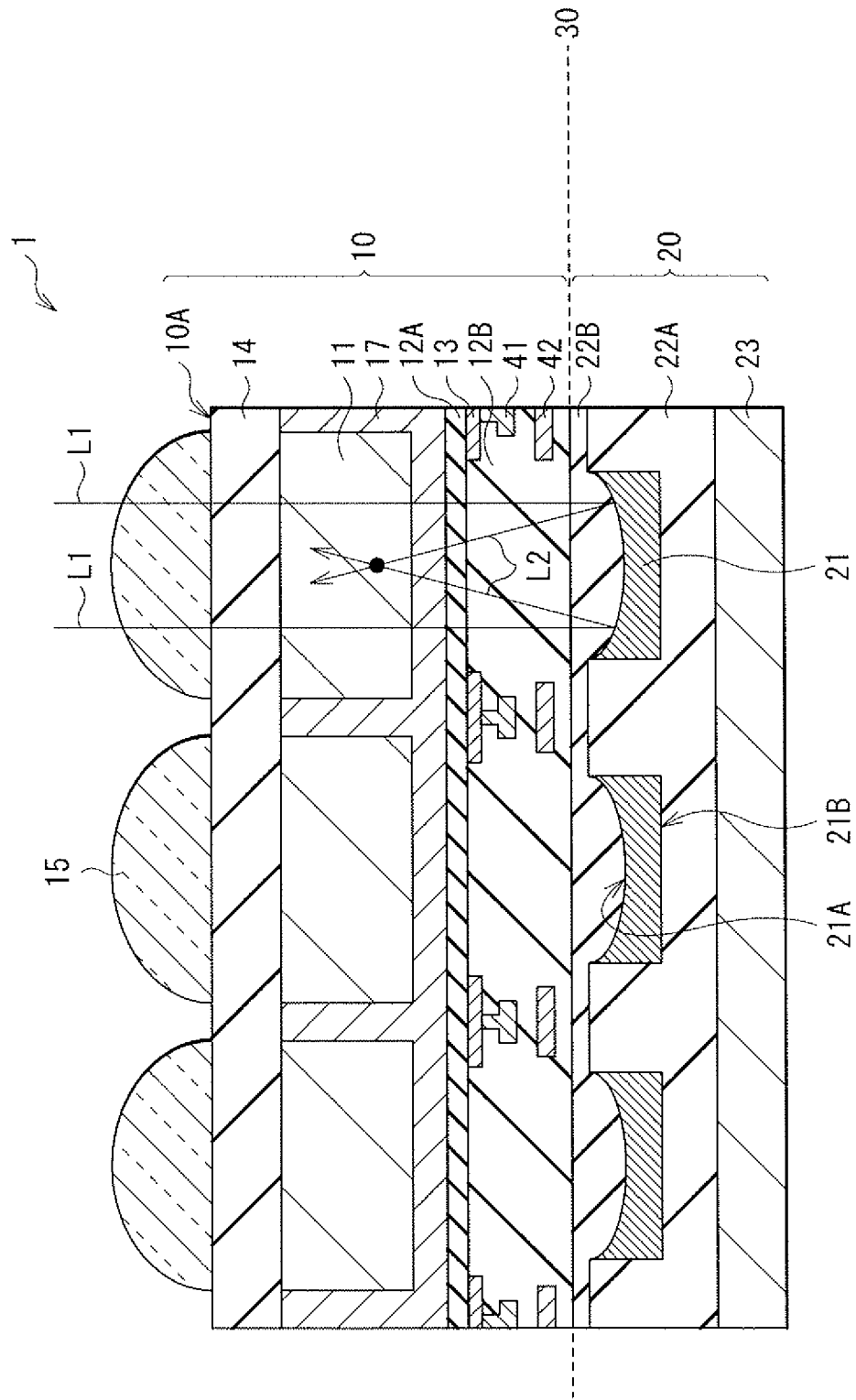

[Fig. 2]
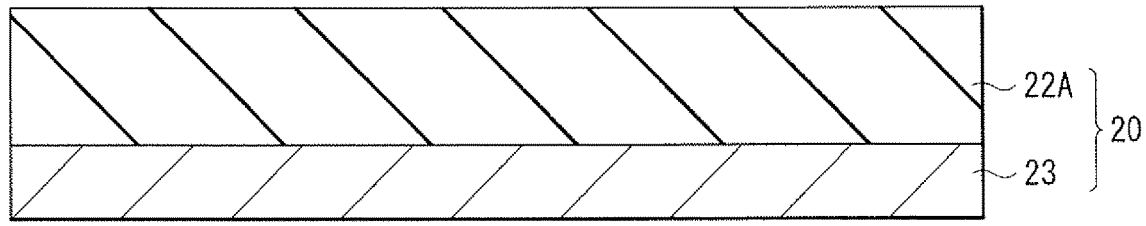
[Fig. 3]
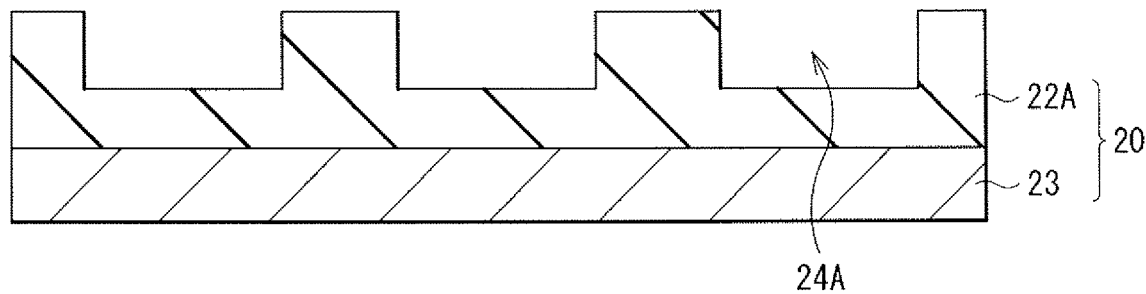
[Fig. 4]
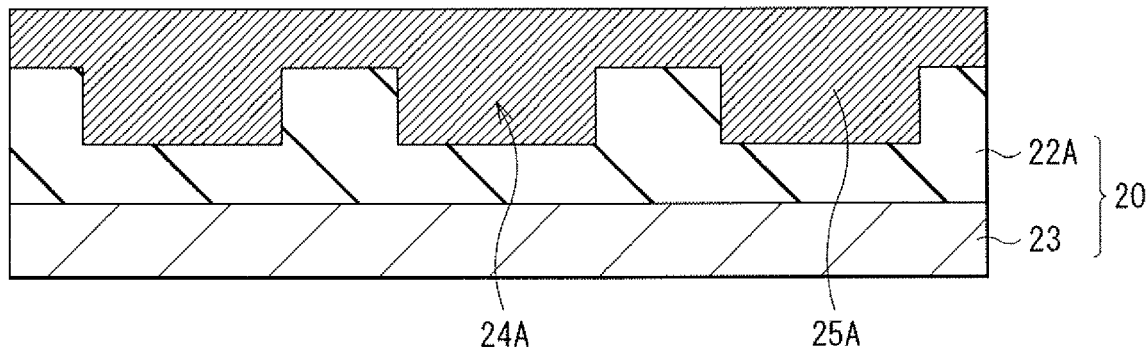
[Fig. 5]
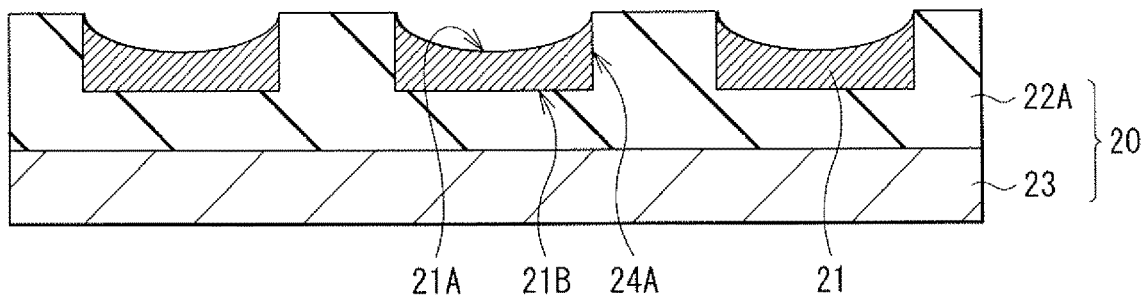

[Fig. 6]
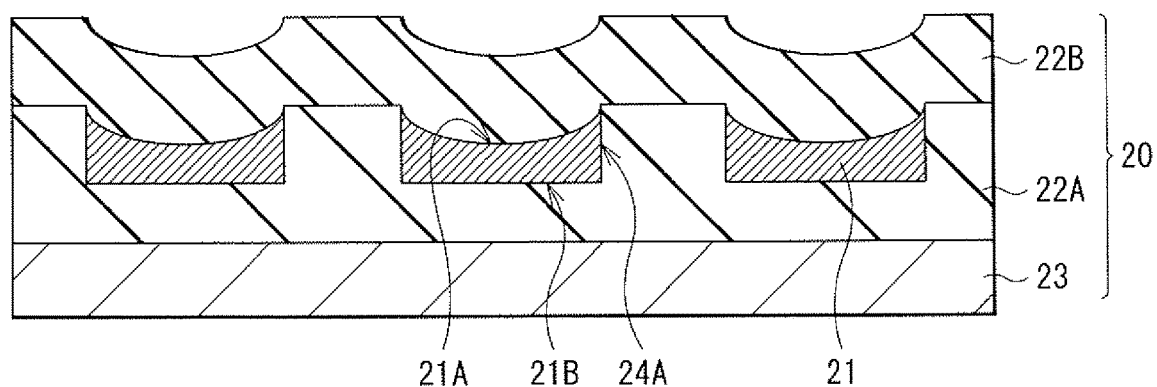
[Fig. 7]
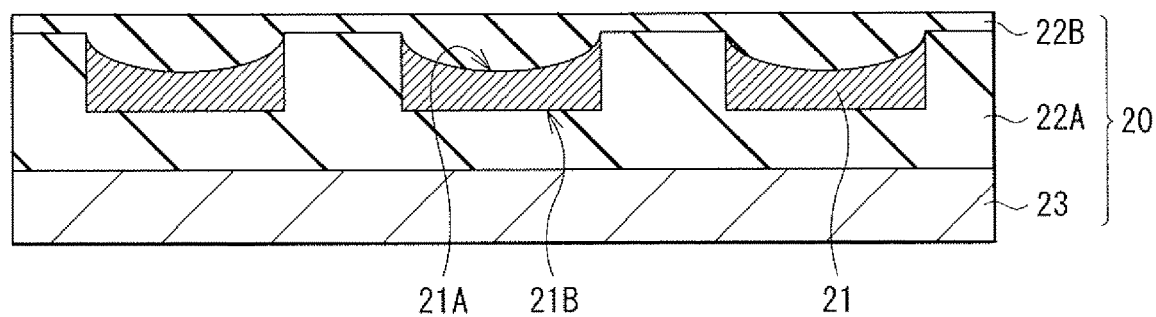

[Fig. 8]
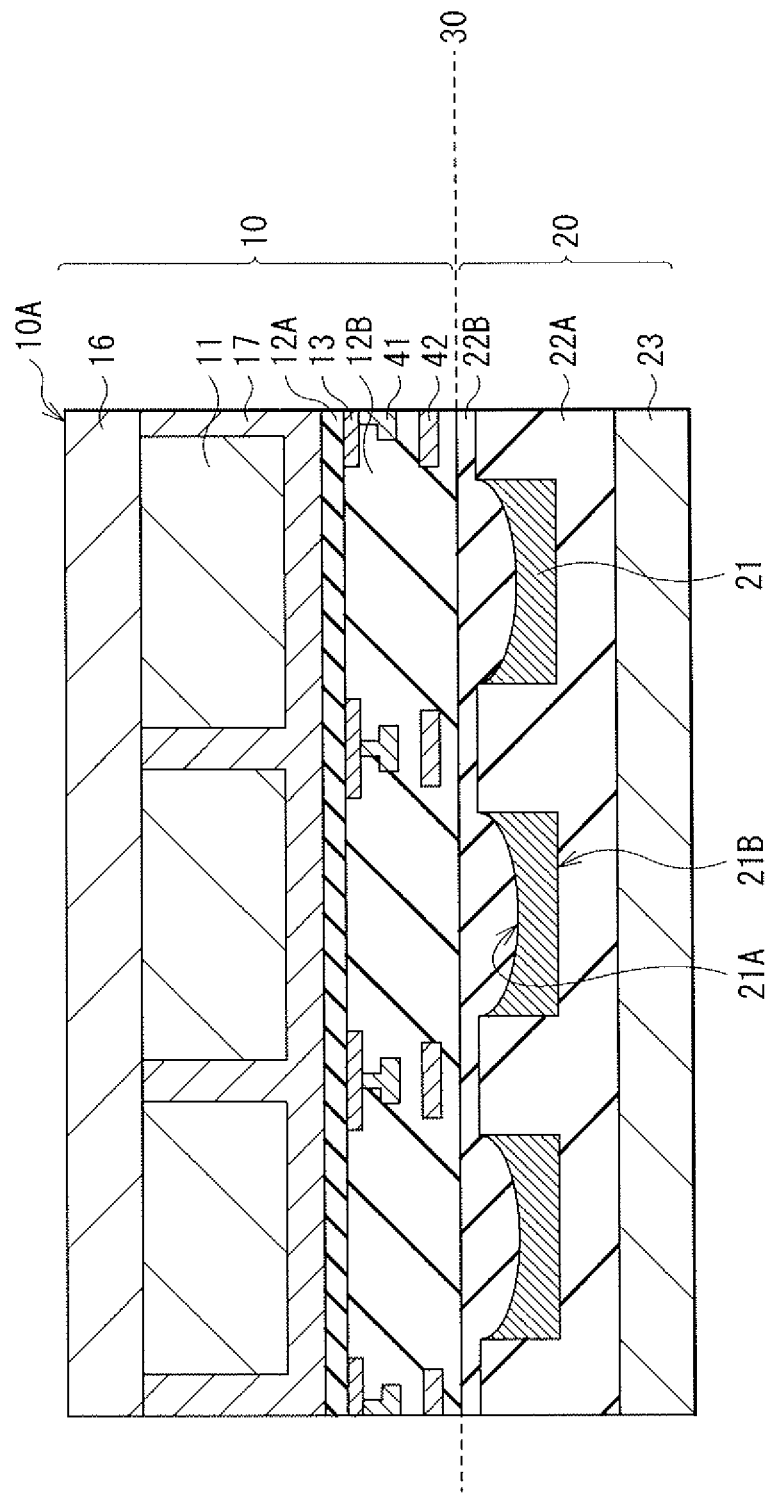

[Fig. 9]
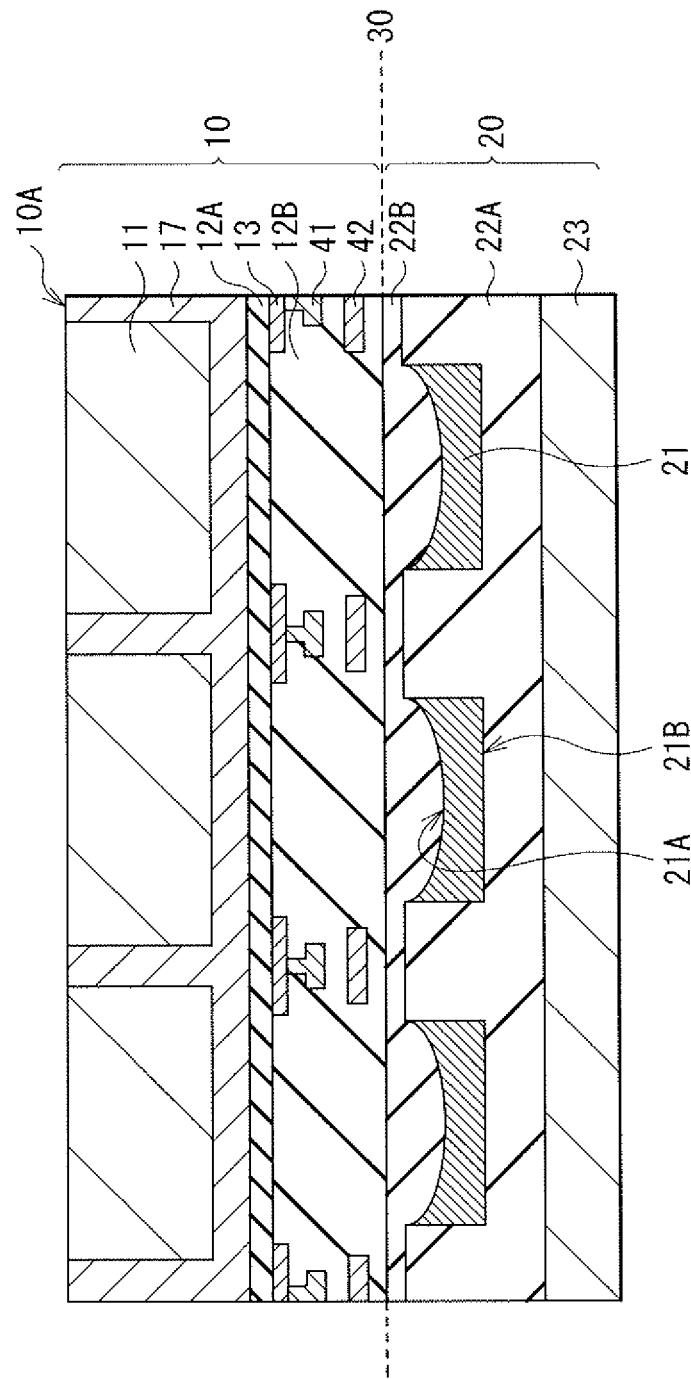

[Fig. 10]
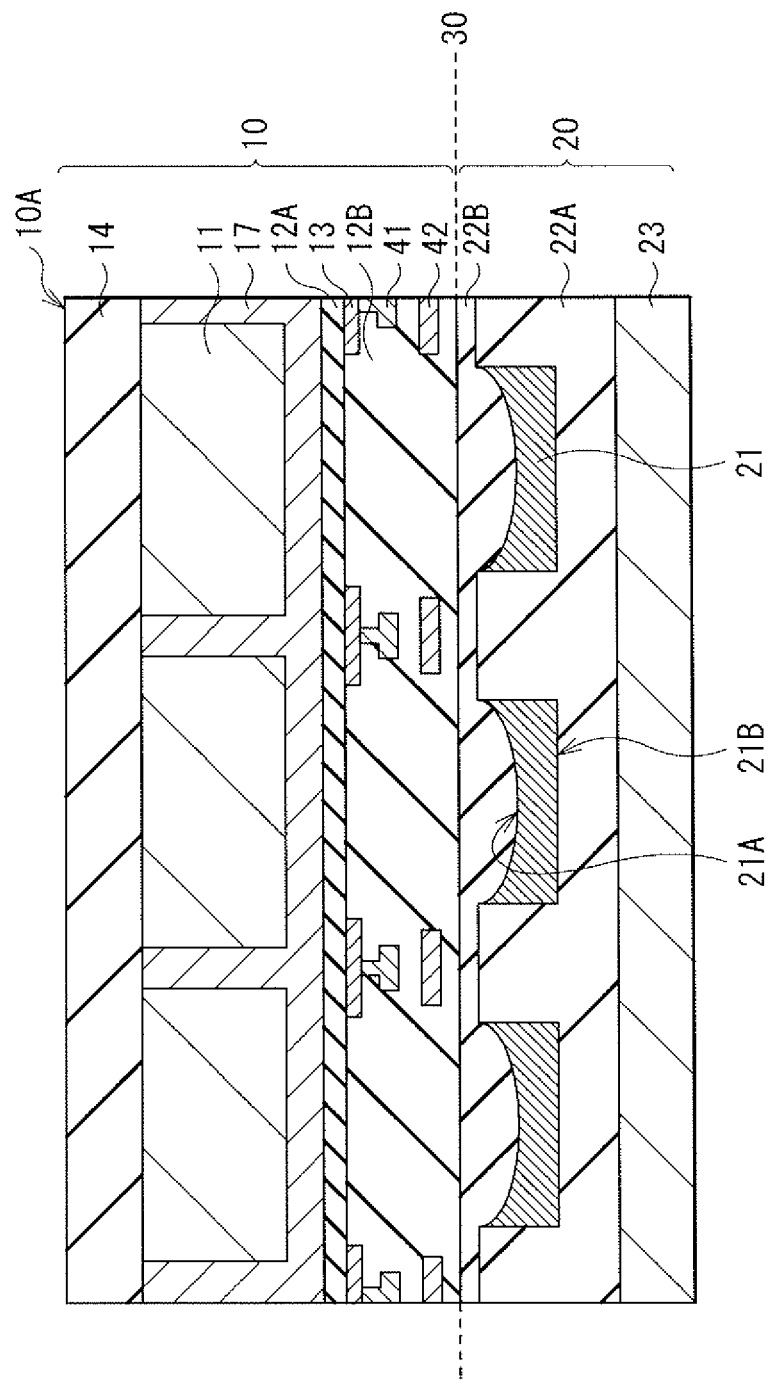

[Fig. 11]
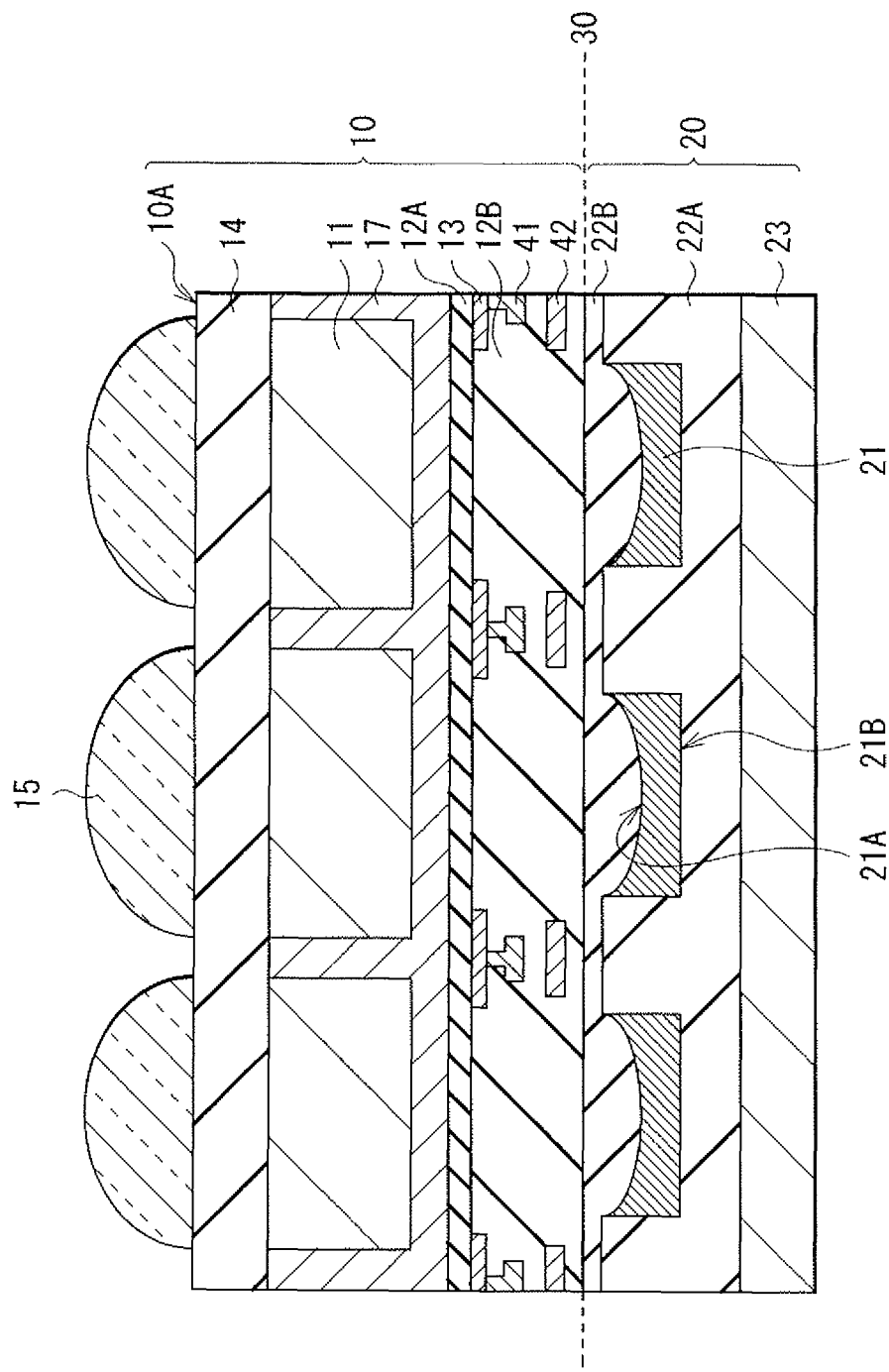

[Fig. 12]
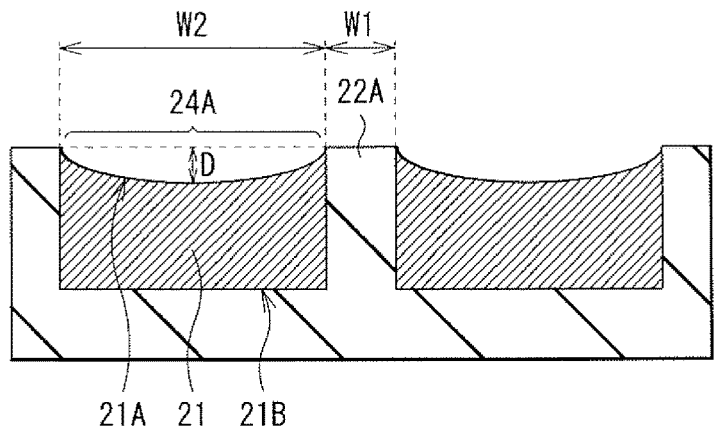
[Fig. 13]
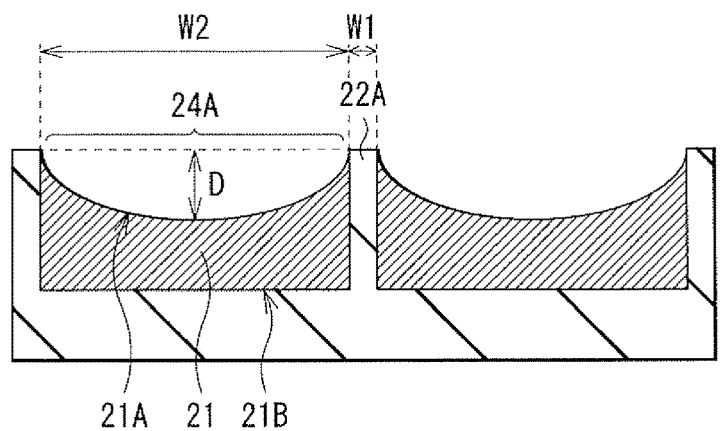
[Fig. 14]
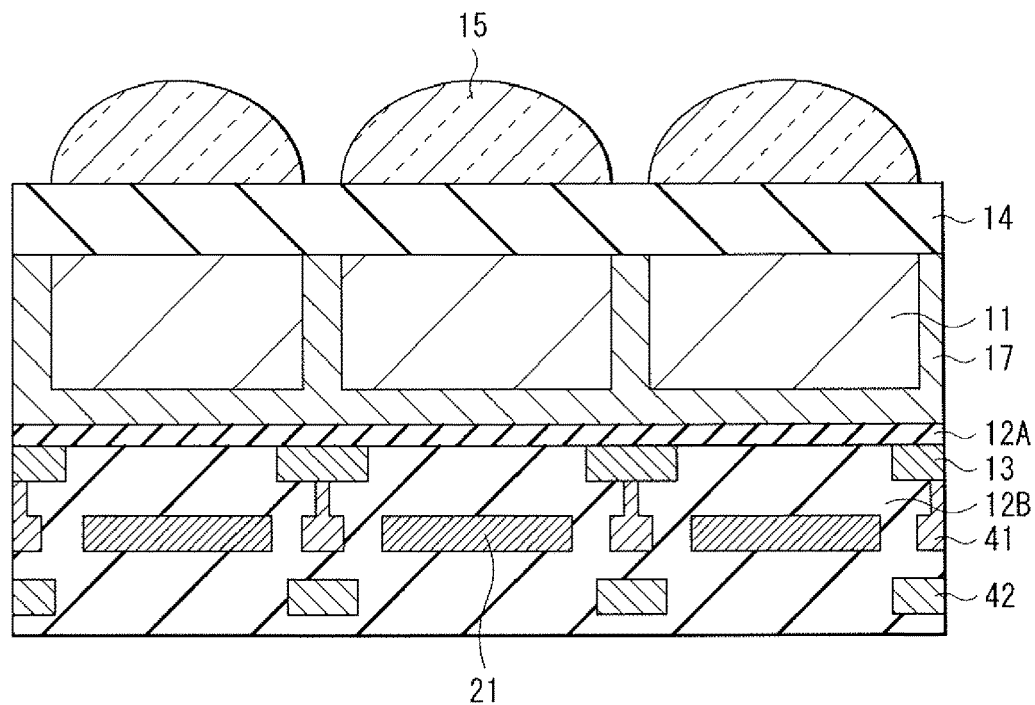

[Fig. 15]
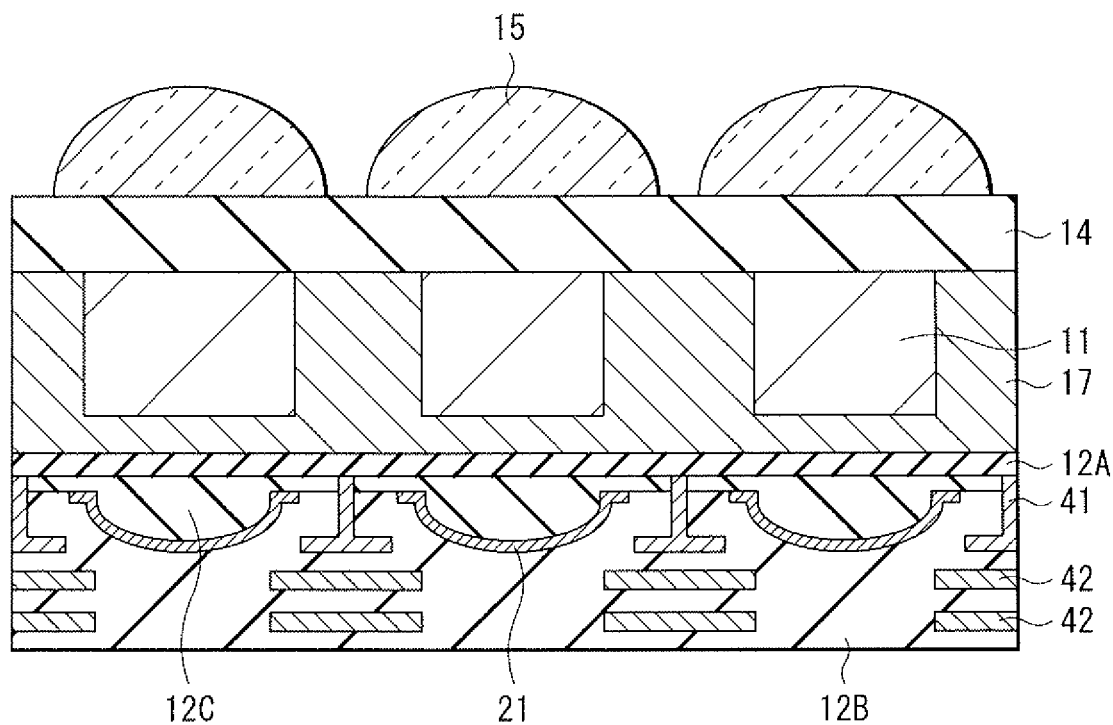
[Fig. 16]
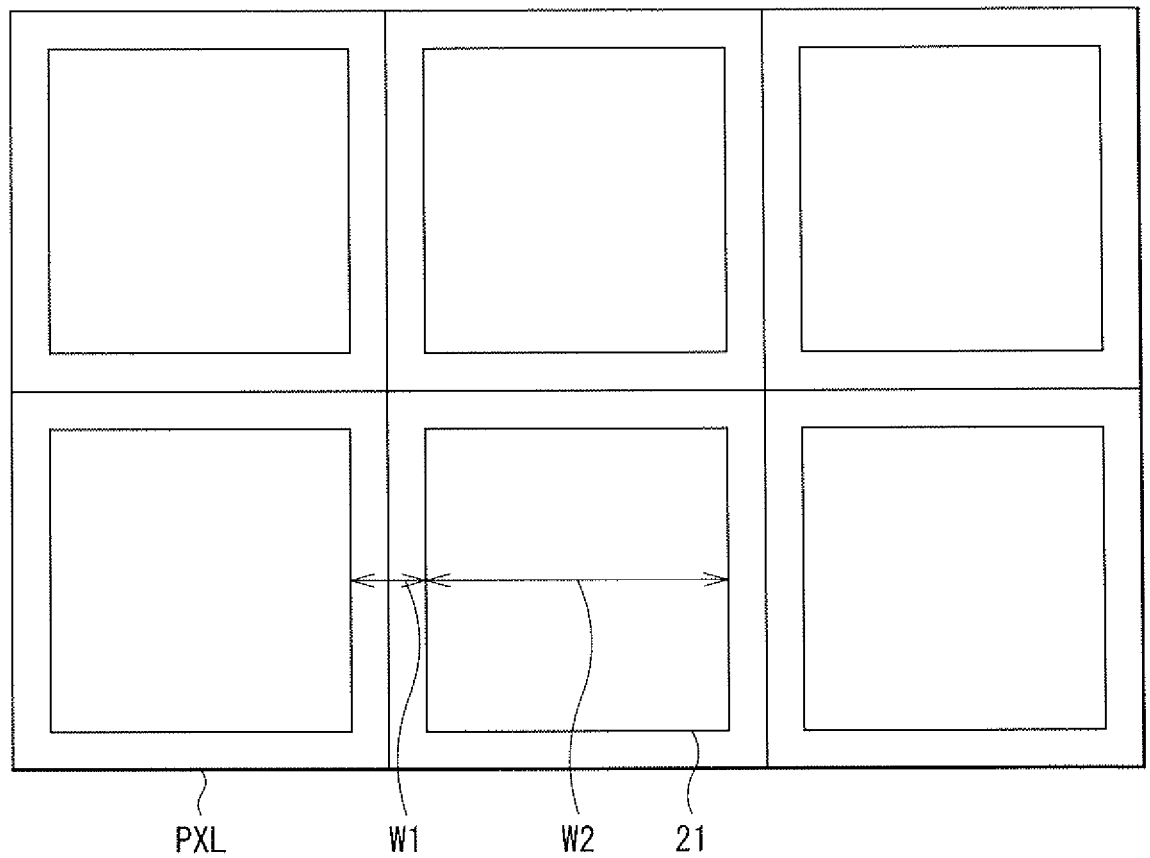

[Fig. 17]
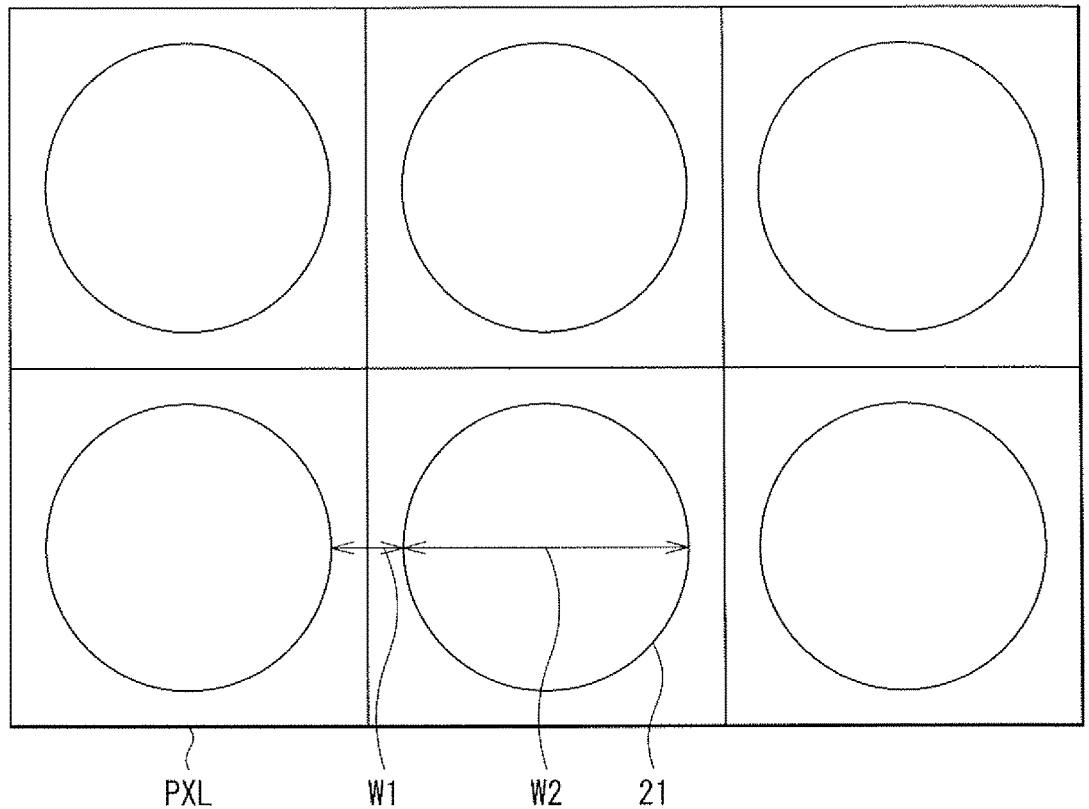
[Fig. 18]
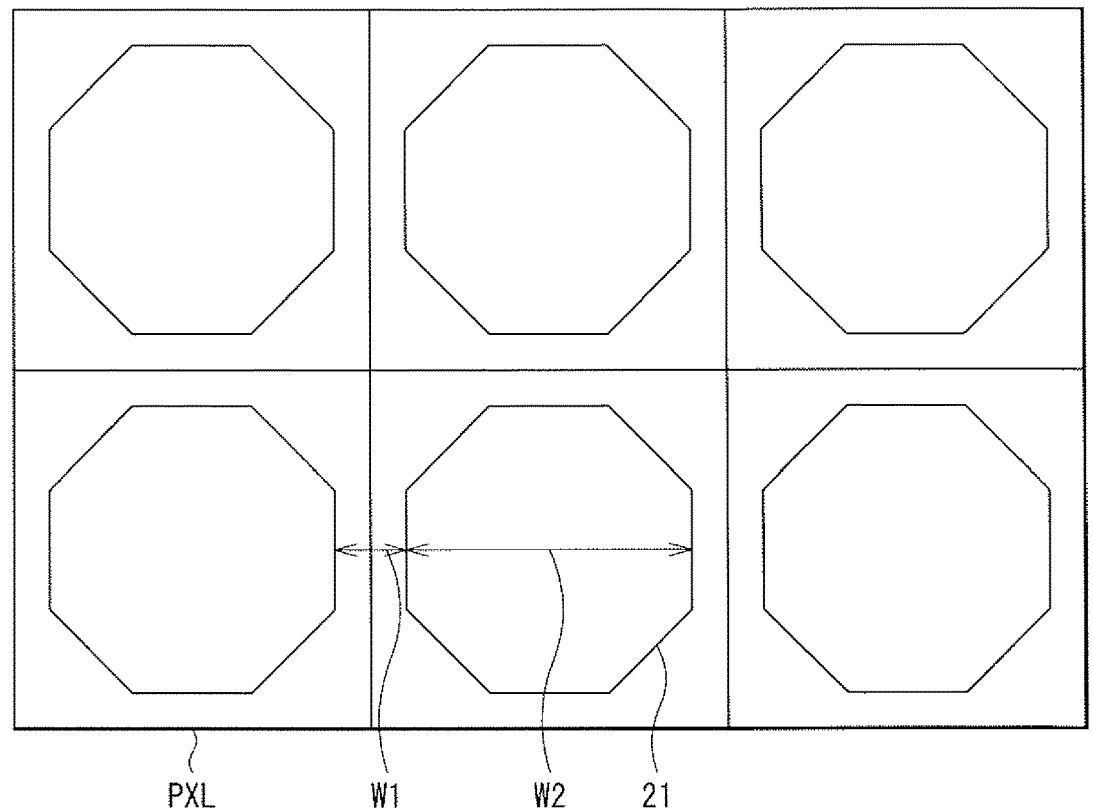

[Fig. 19]
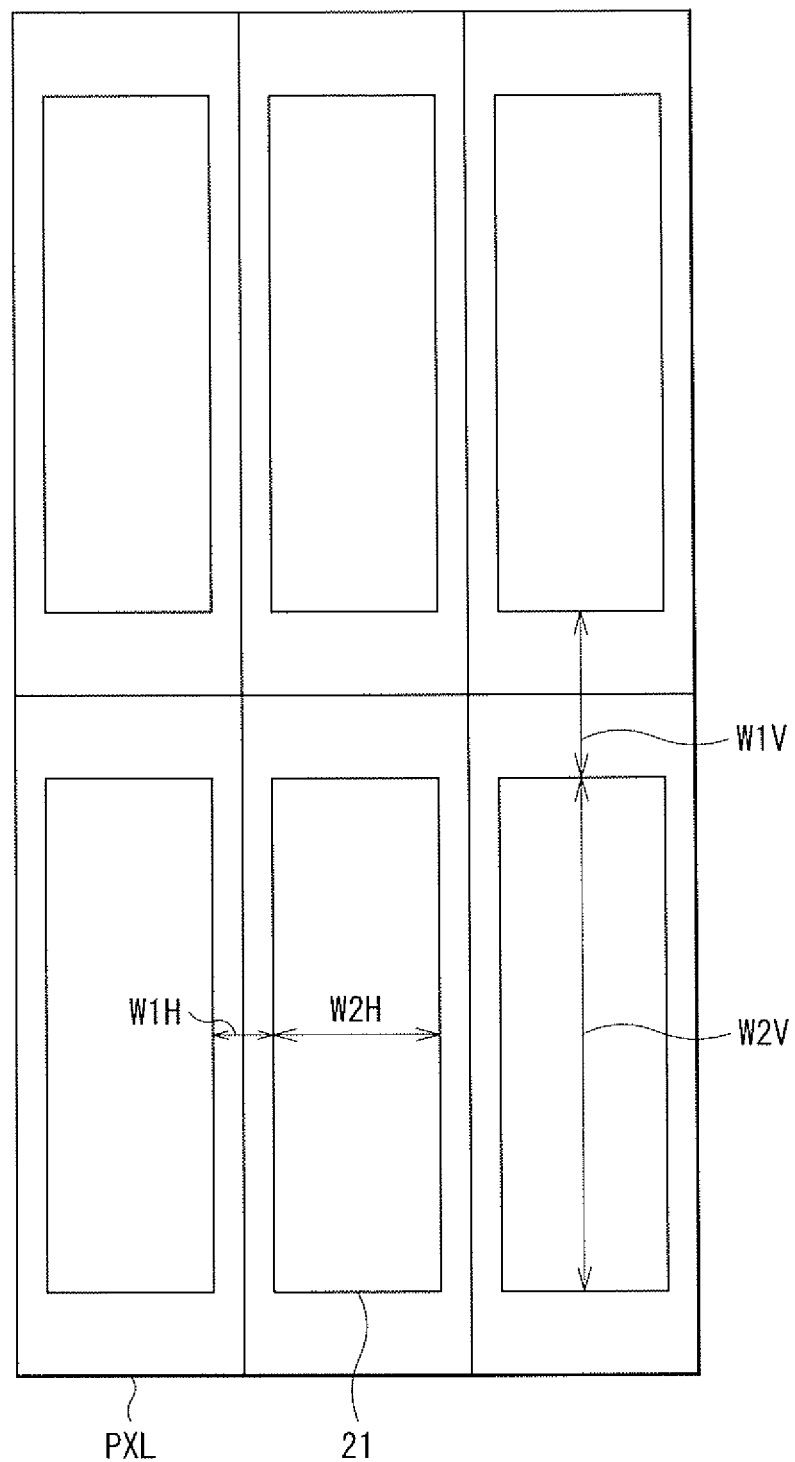

[Fig. 20]
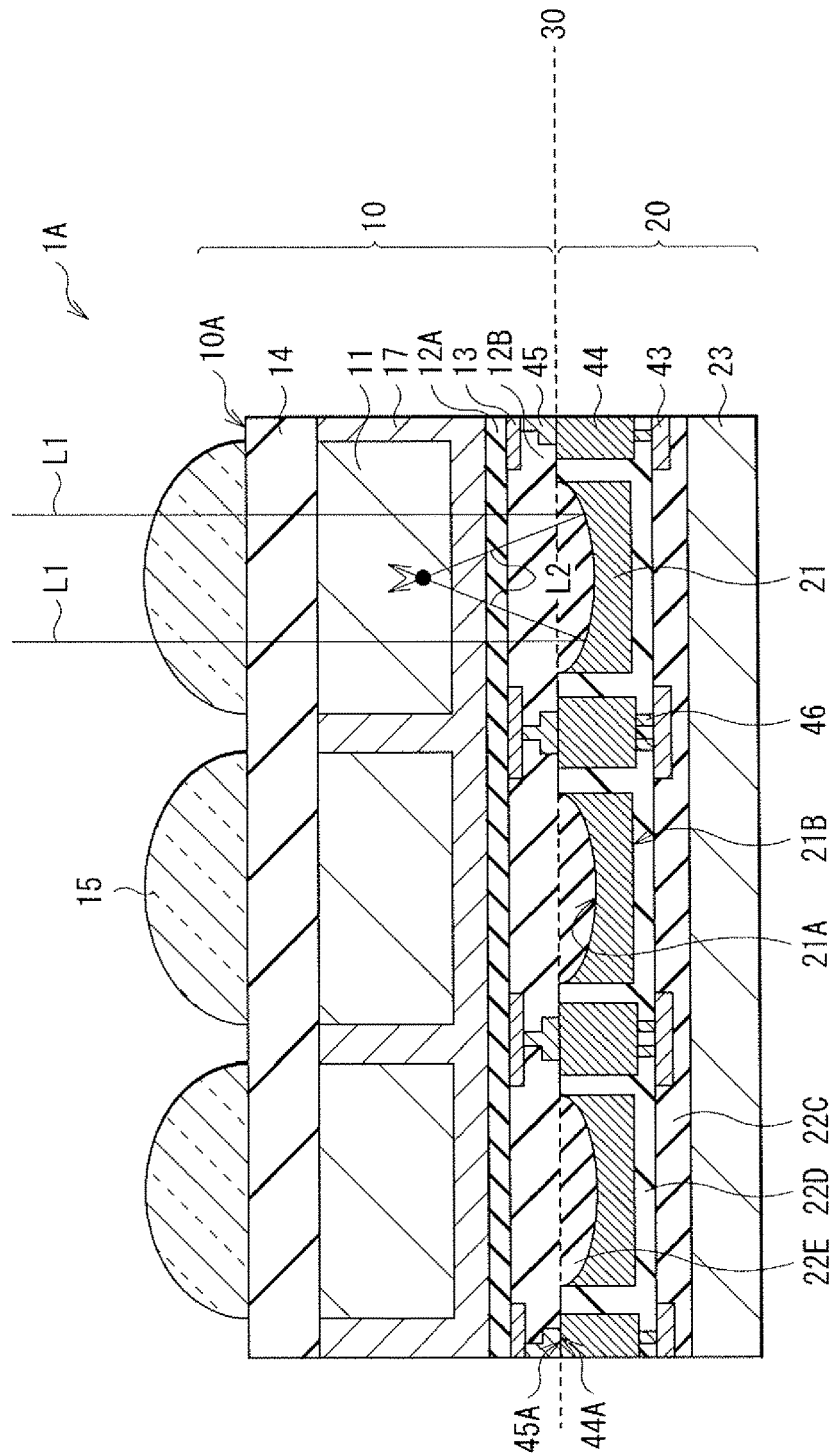
[Fig. 21]
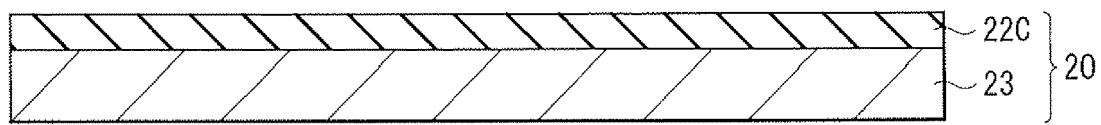

[Fig. 22]
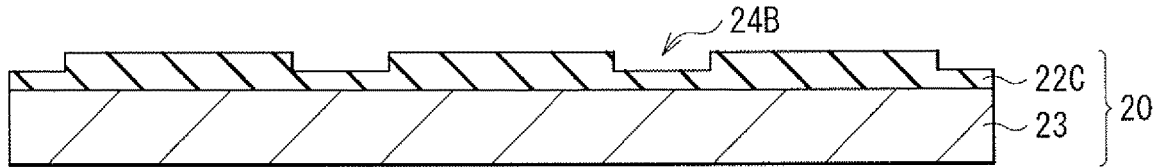
[Fig. 23]
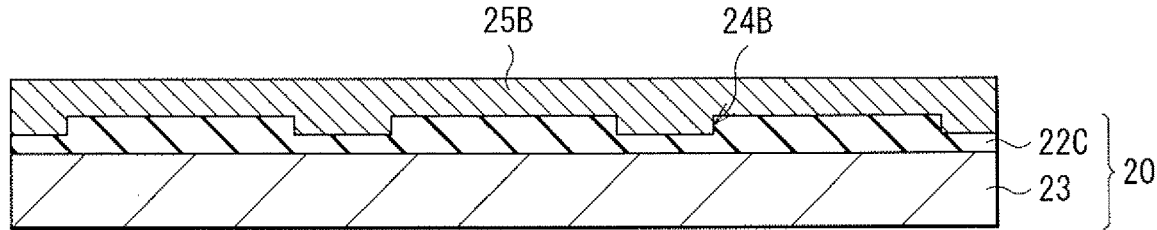
[Fig. 24]
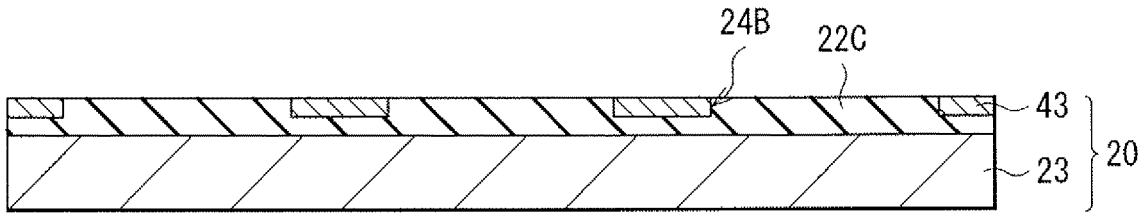
[Fig. 25]
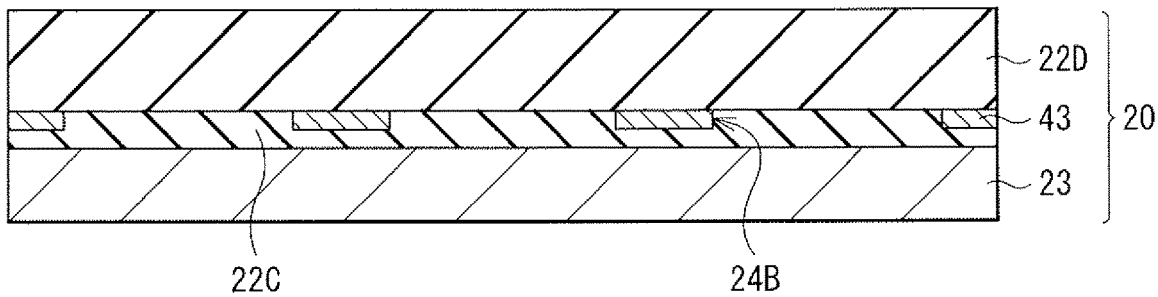
[Fig. 26]
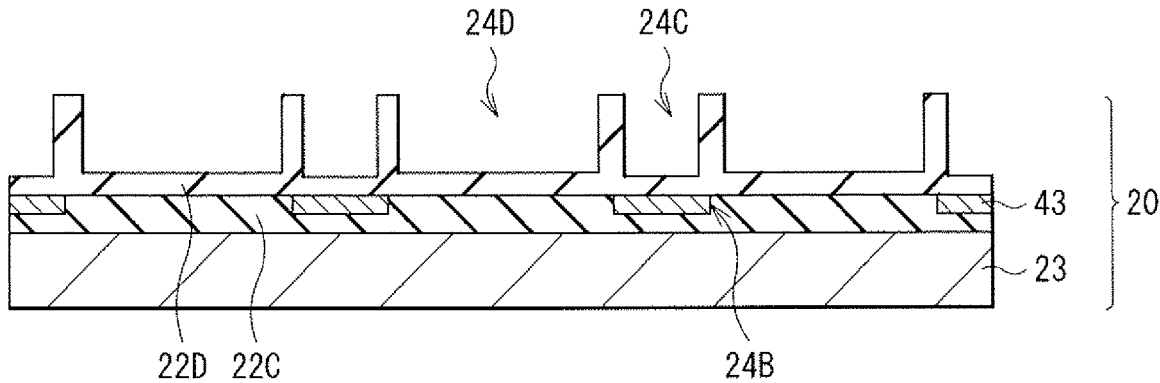

[Fig. 27]
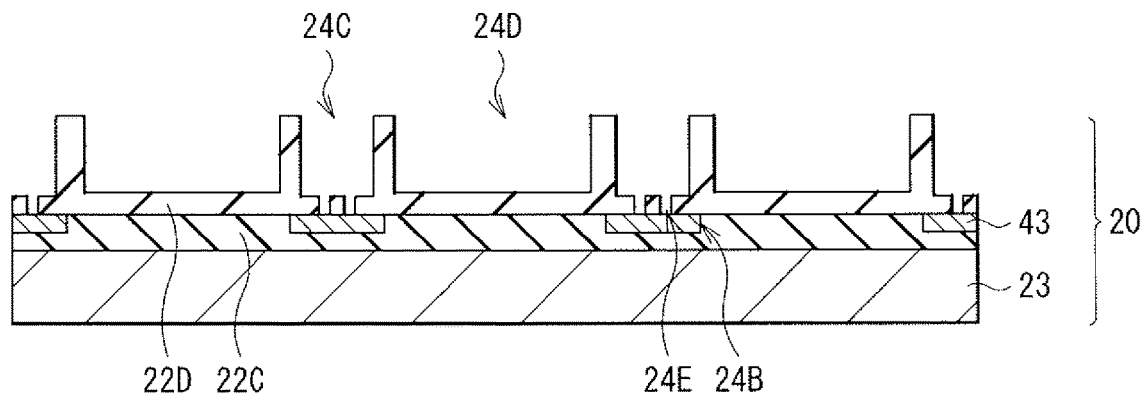
[Fig. 28]
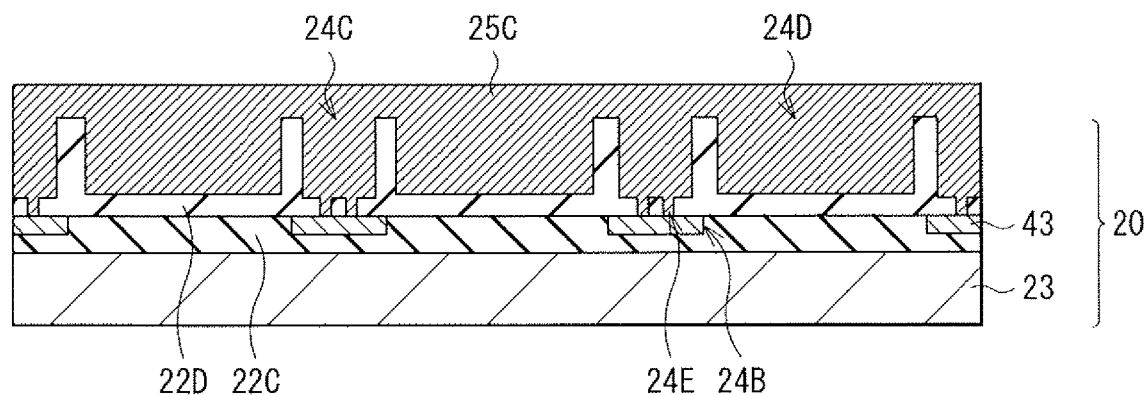
[Fig. 29]
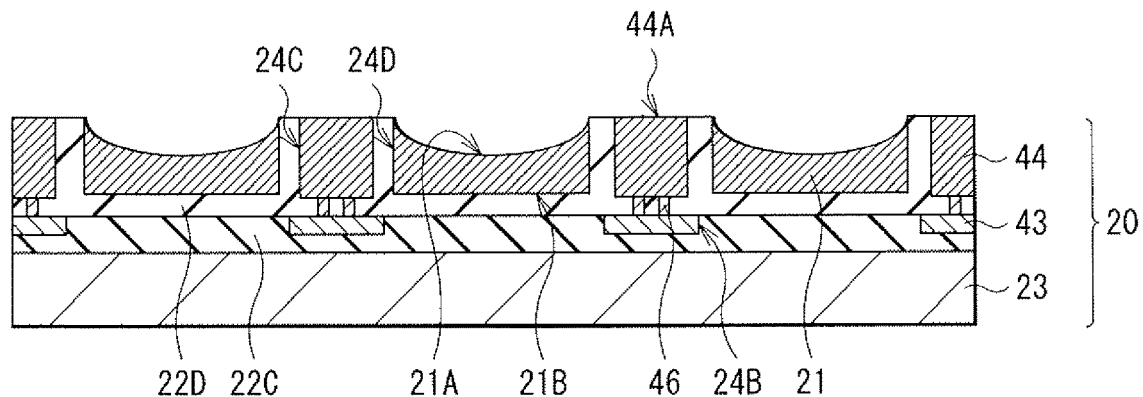

[Fig. 30]
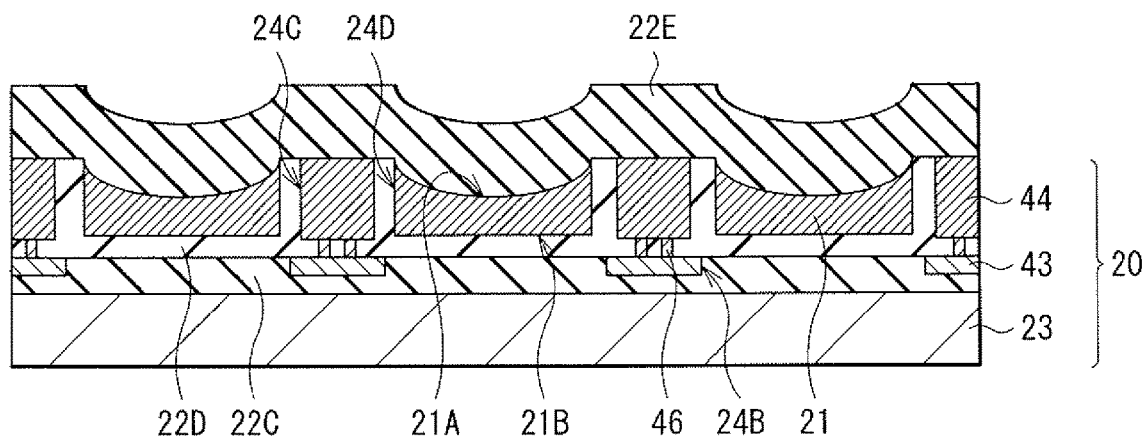
[Fig. 31]
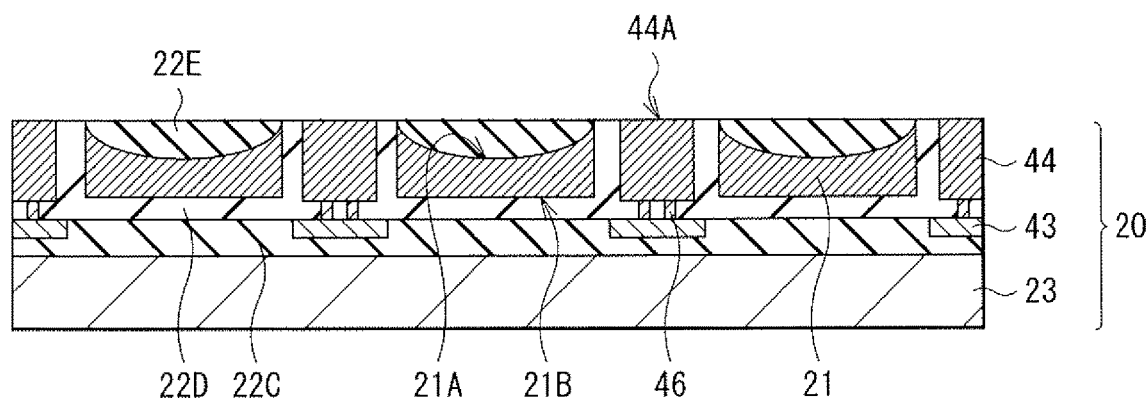

[Fig. 32]
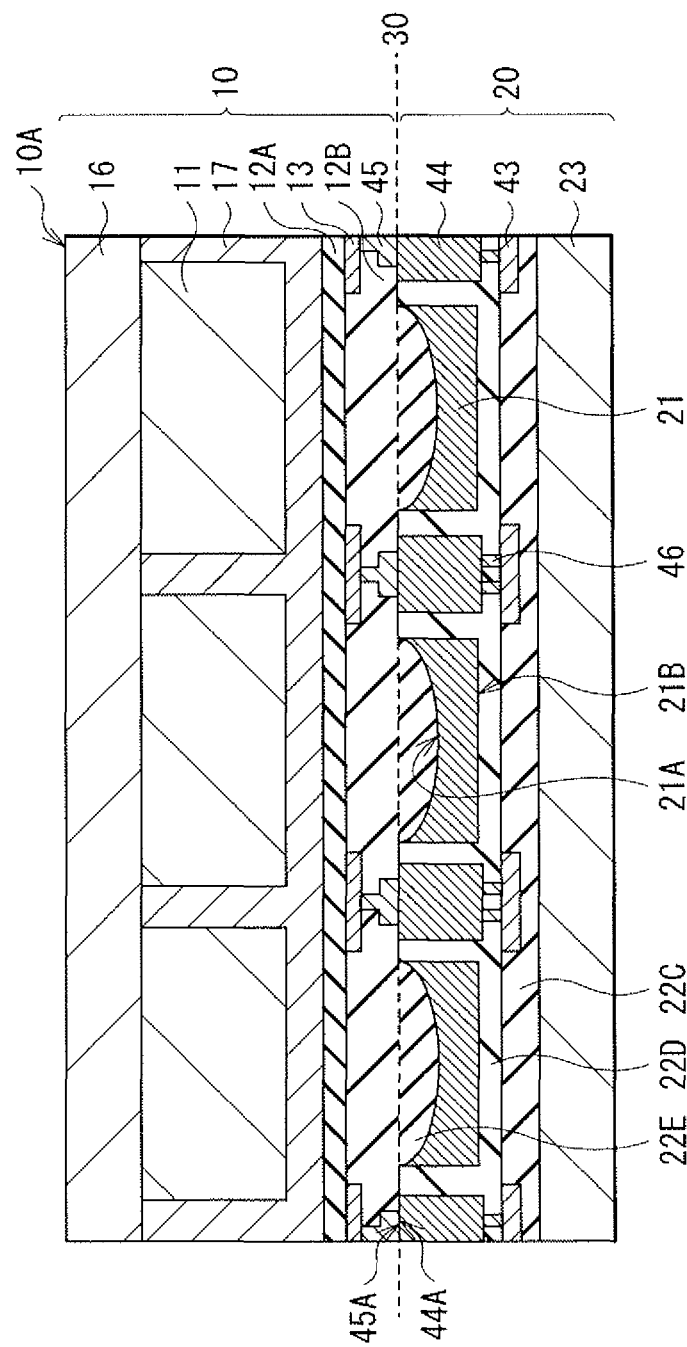

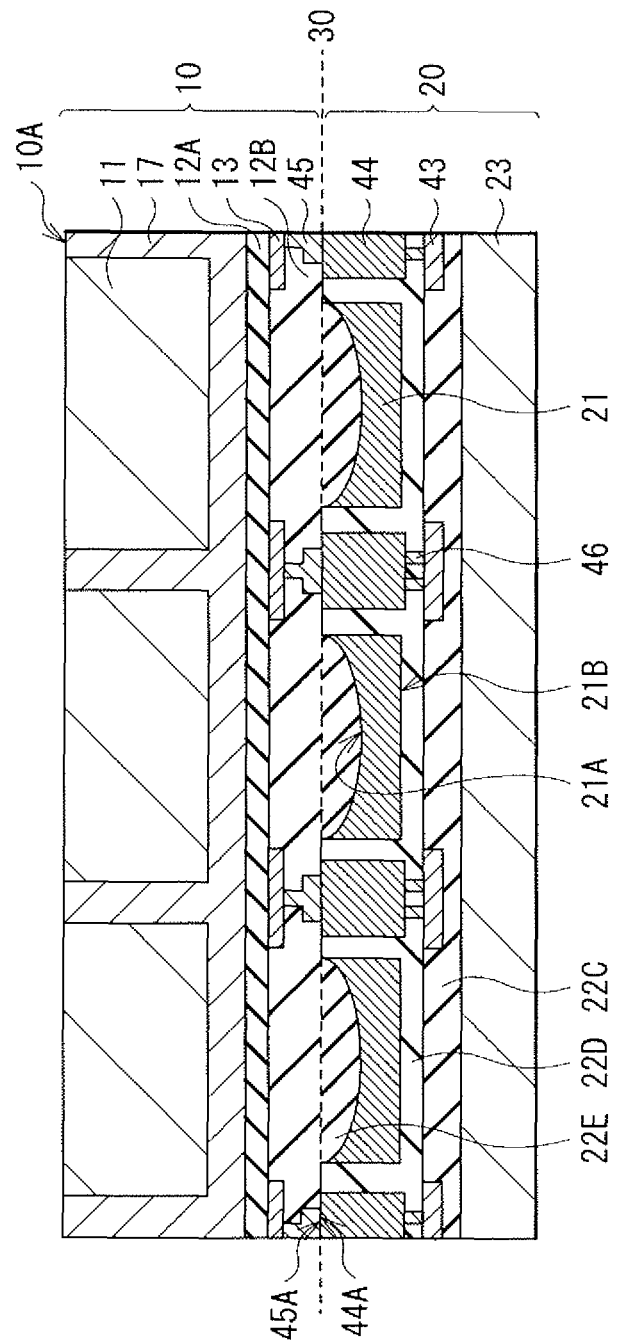
[Fig. 33]

[Fig. 34]
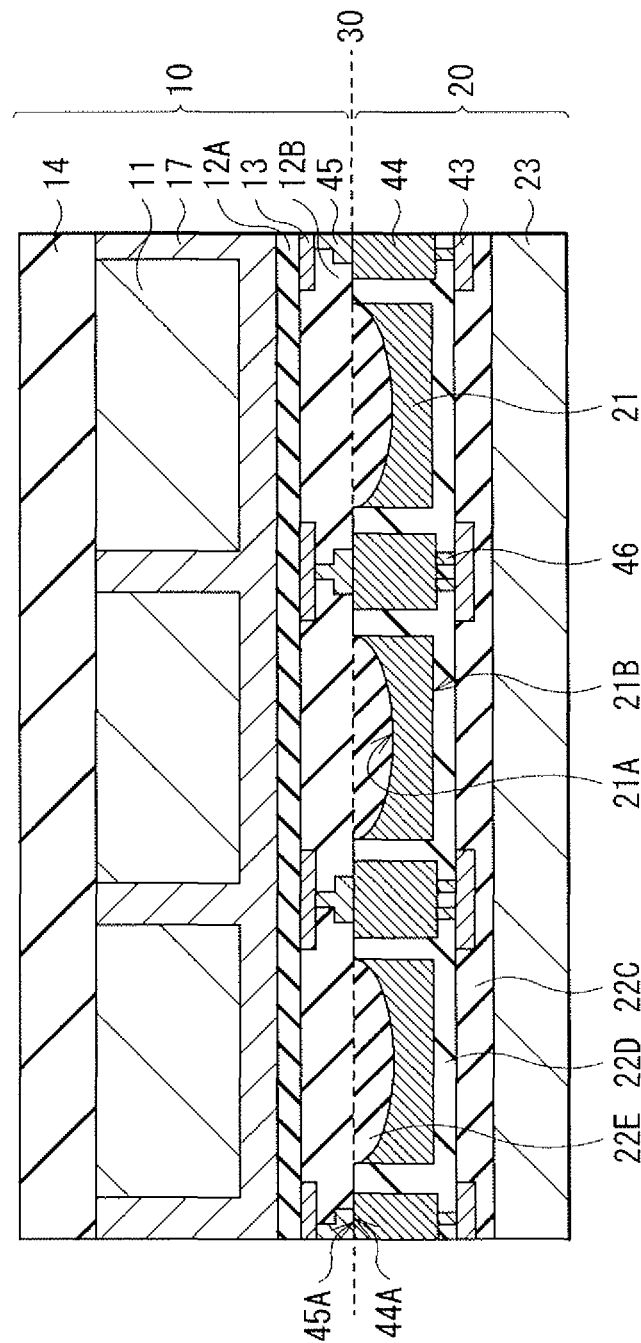

[Fig. 35]
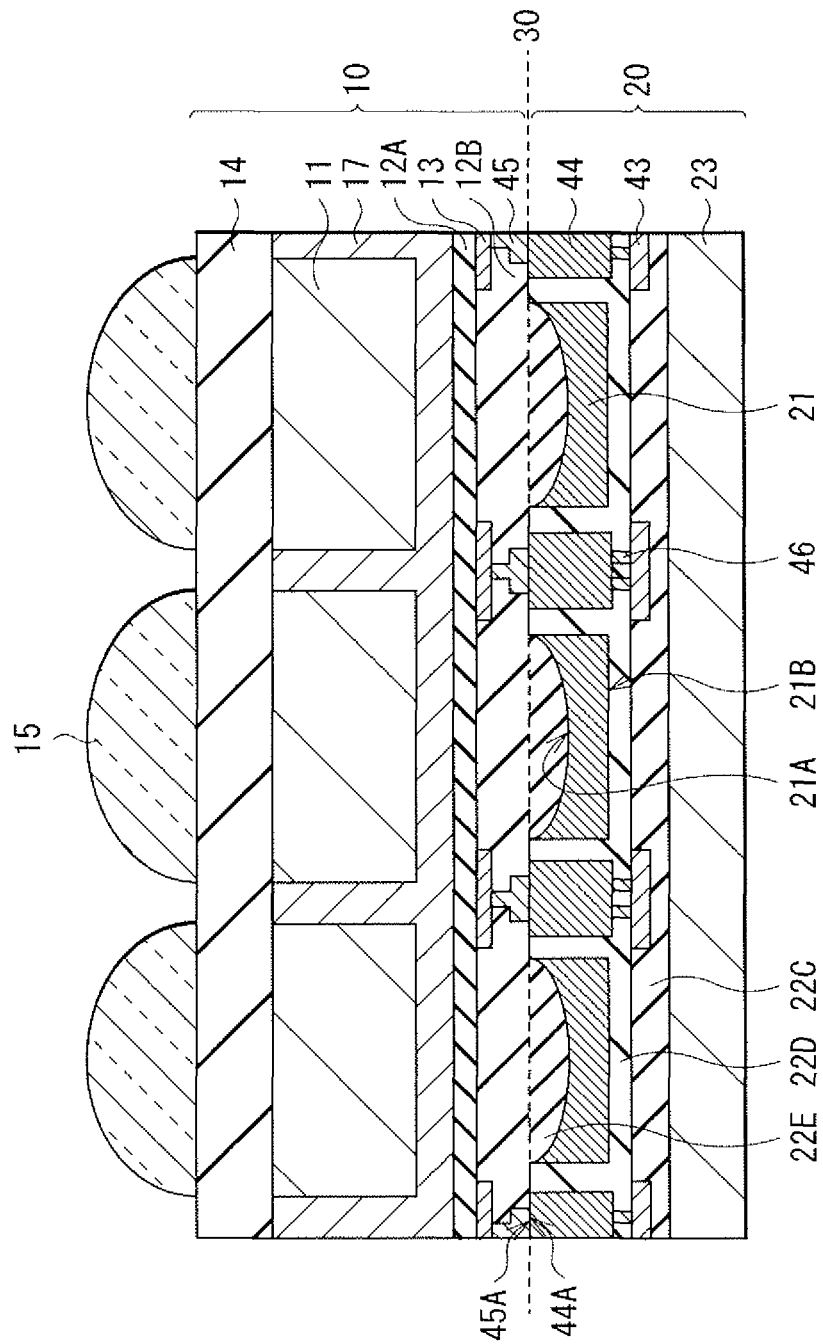

[Fig. 36]
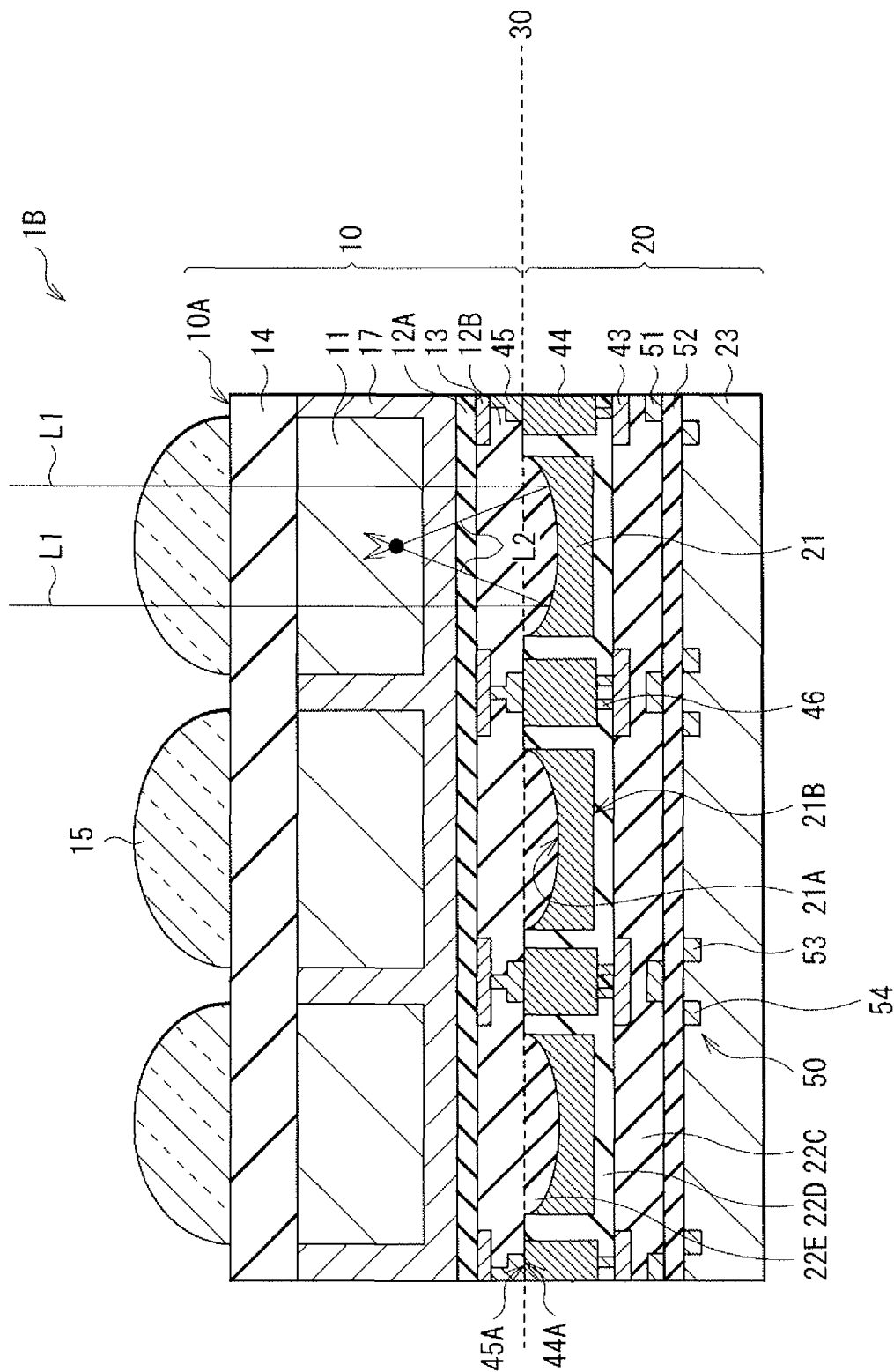

[Fig. 37]
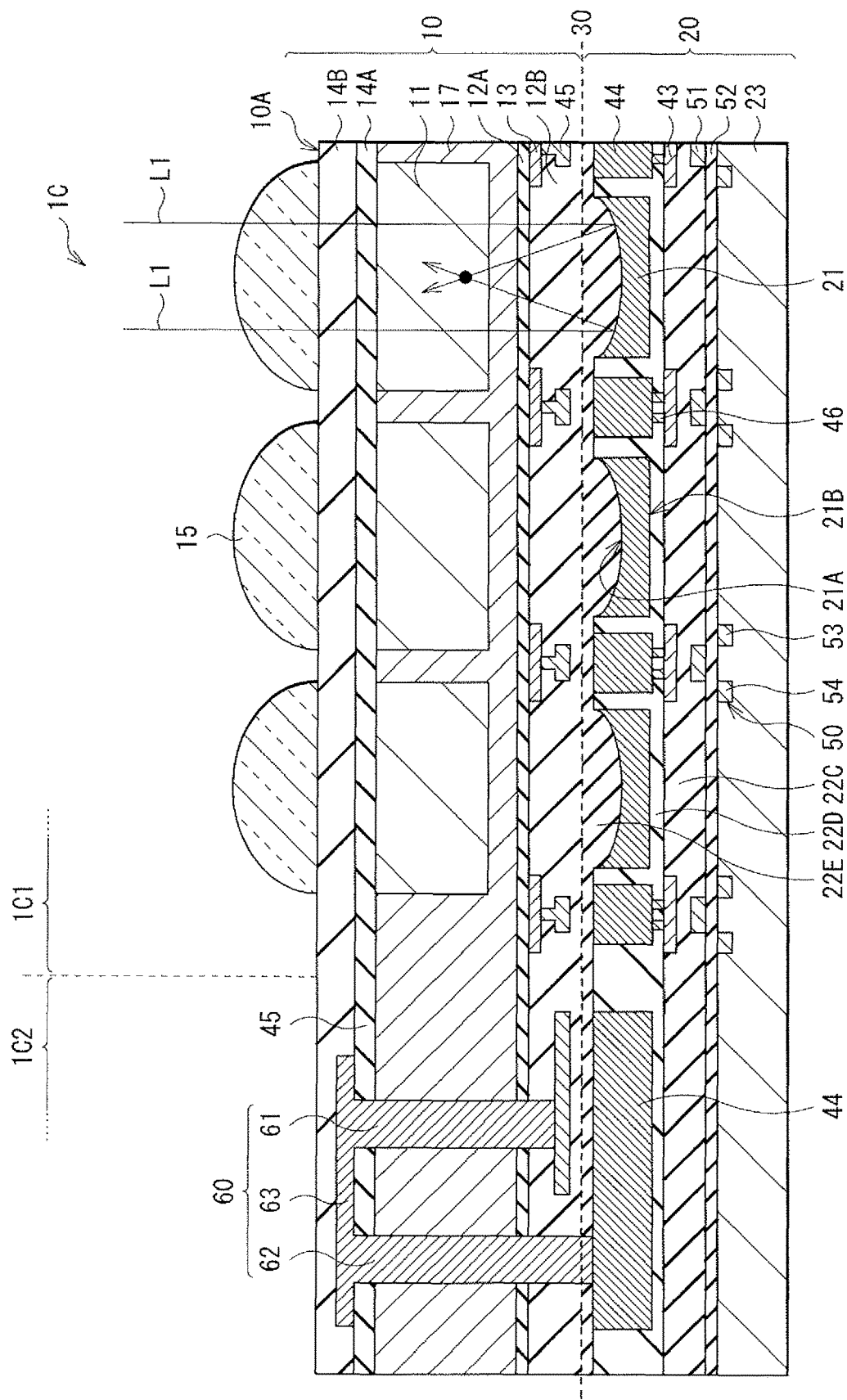

[Fig. 38]
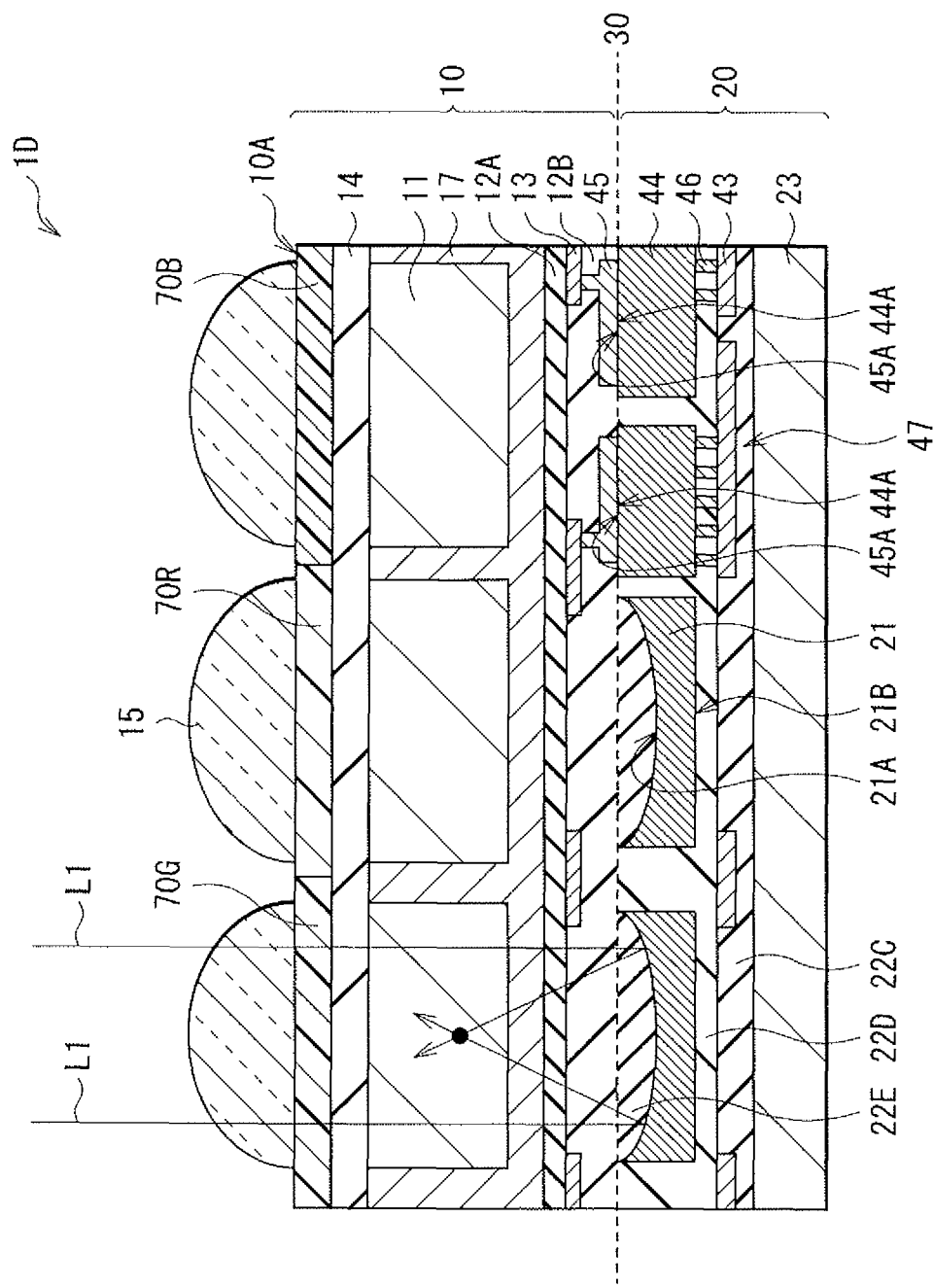

[Fig. 39]
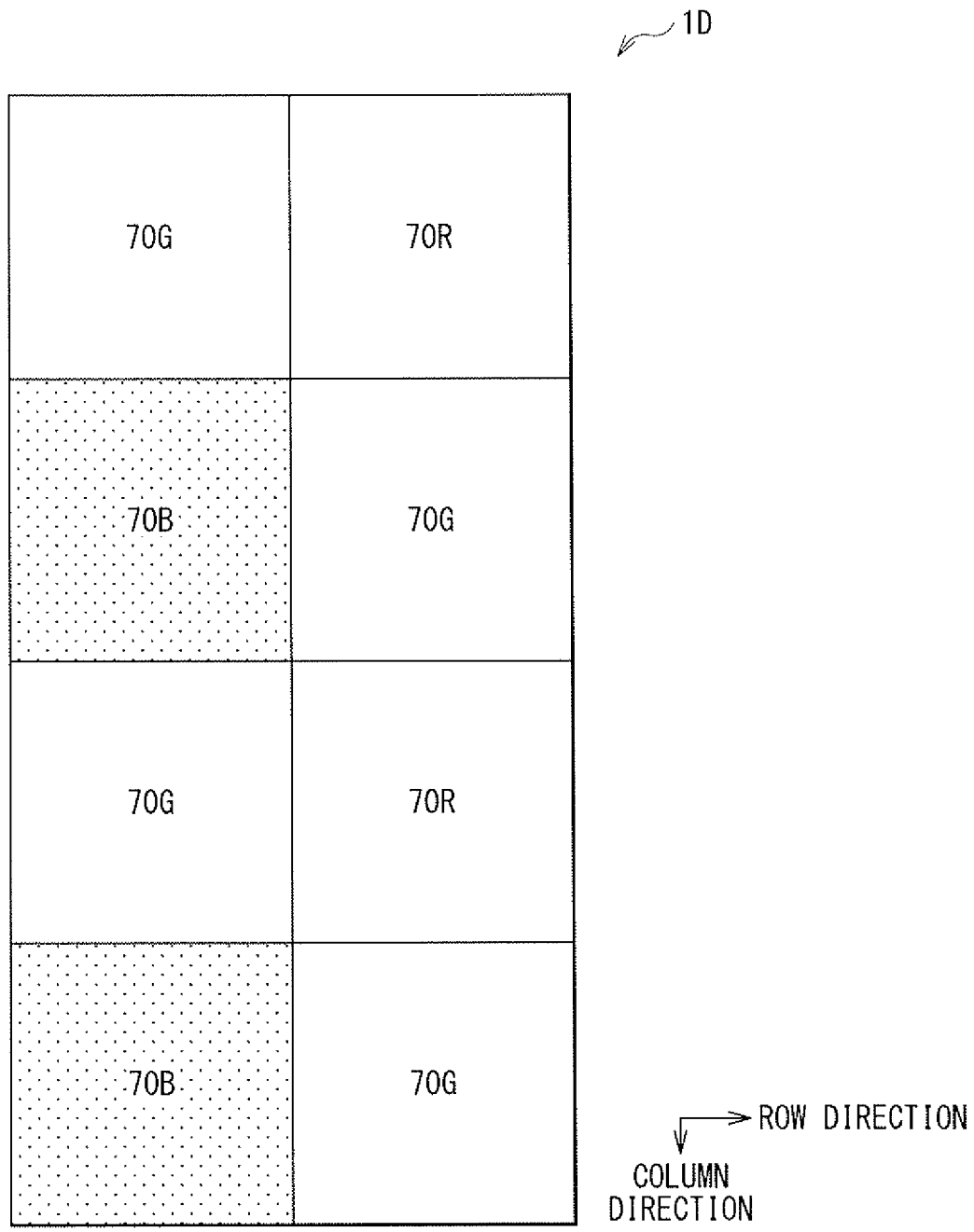

[Fig. 40]
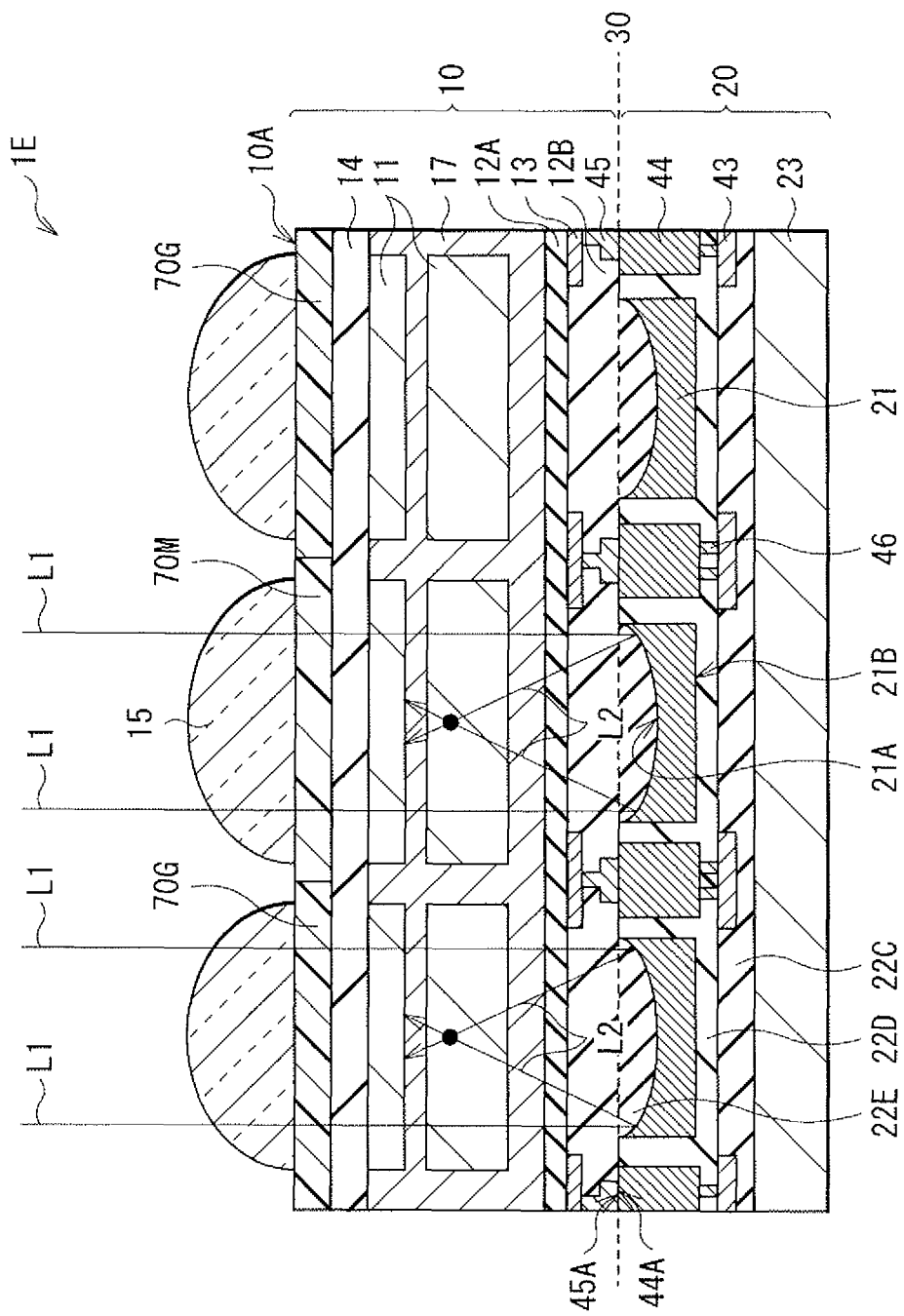

[Fig. 41]
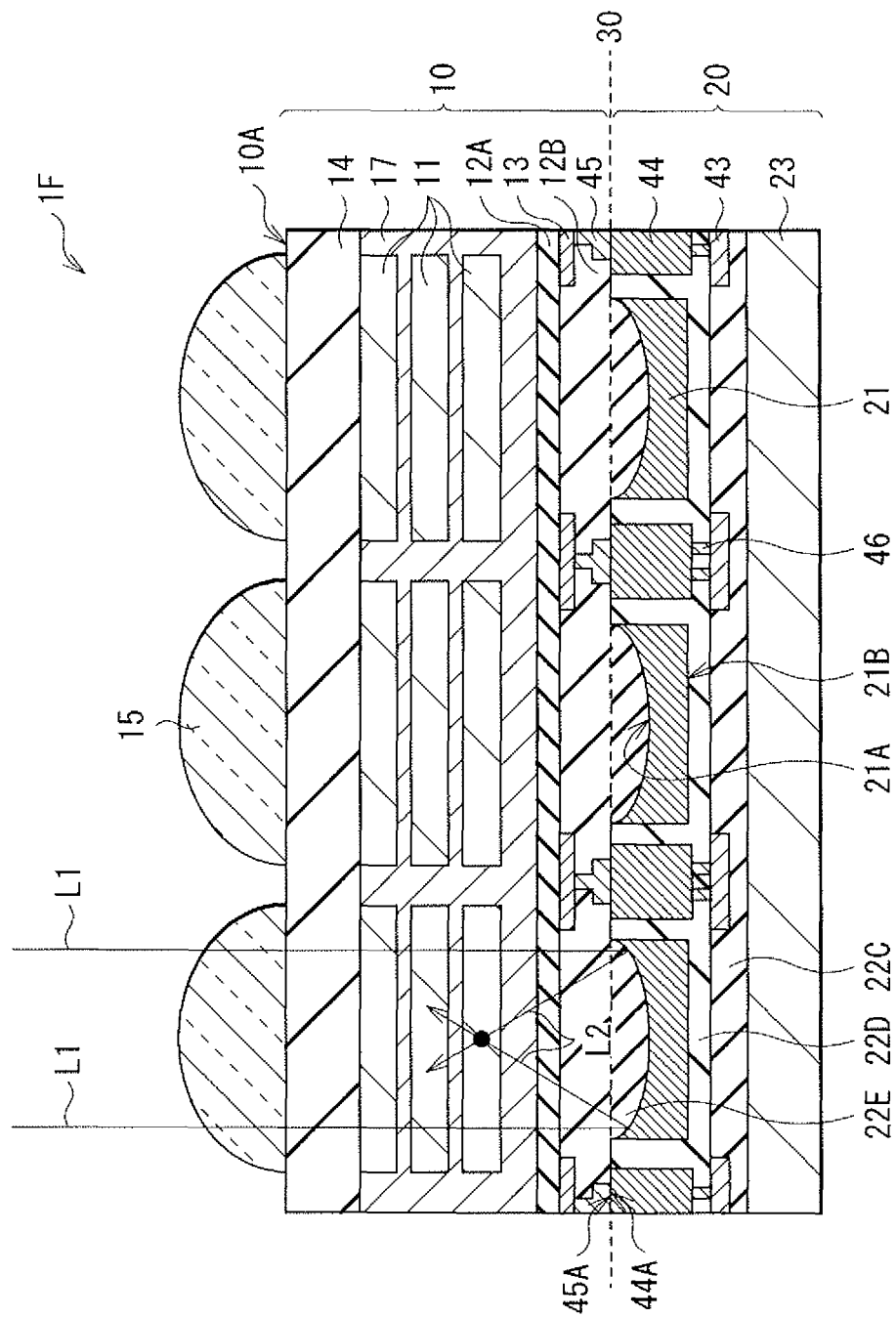

[Fig. 42]
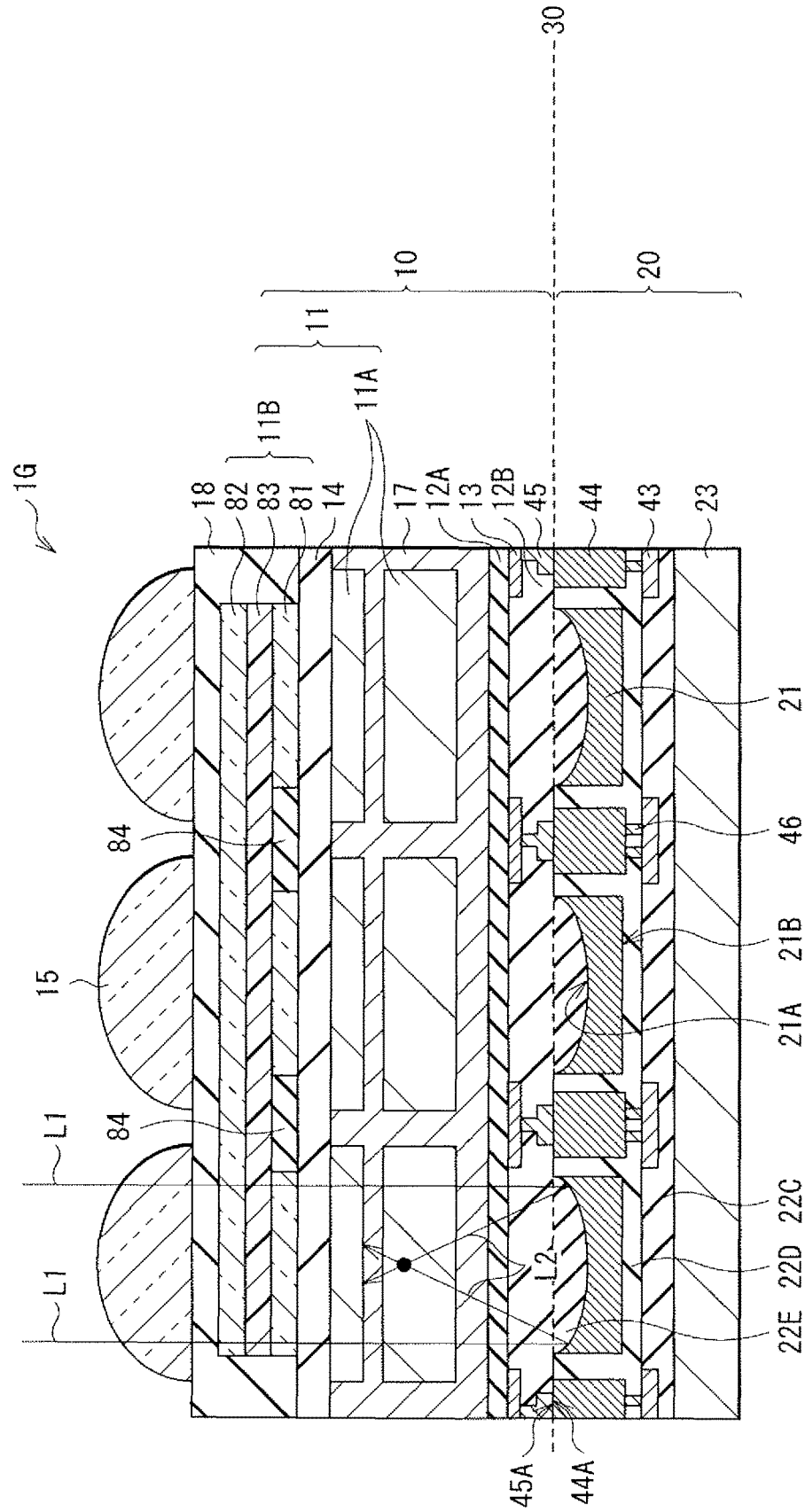

[Fig. 43]
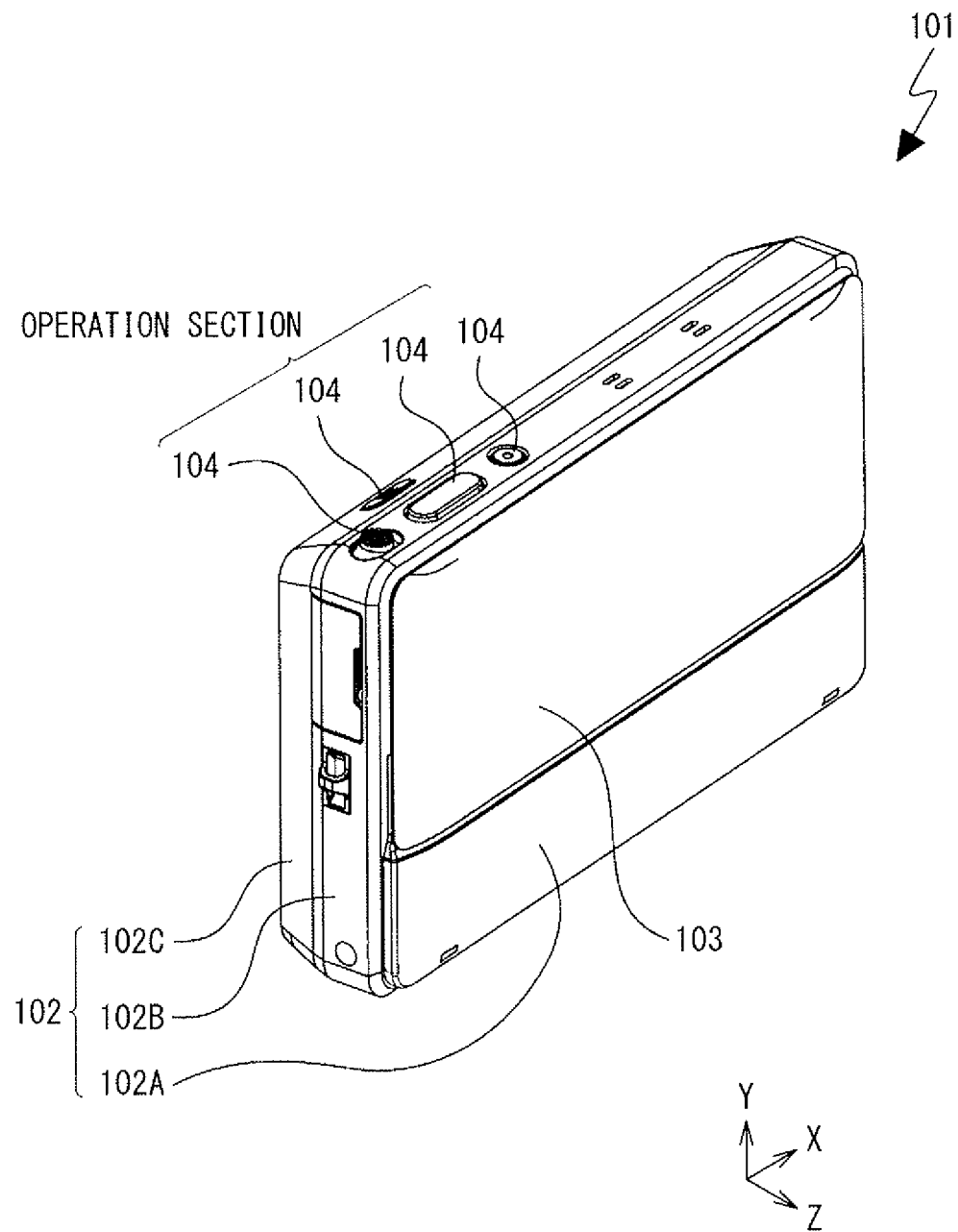

[Fig. 44]
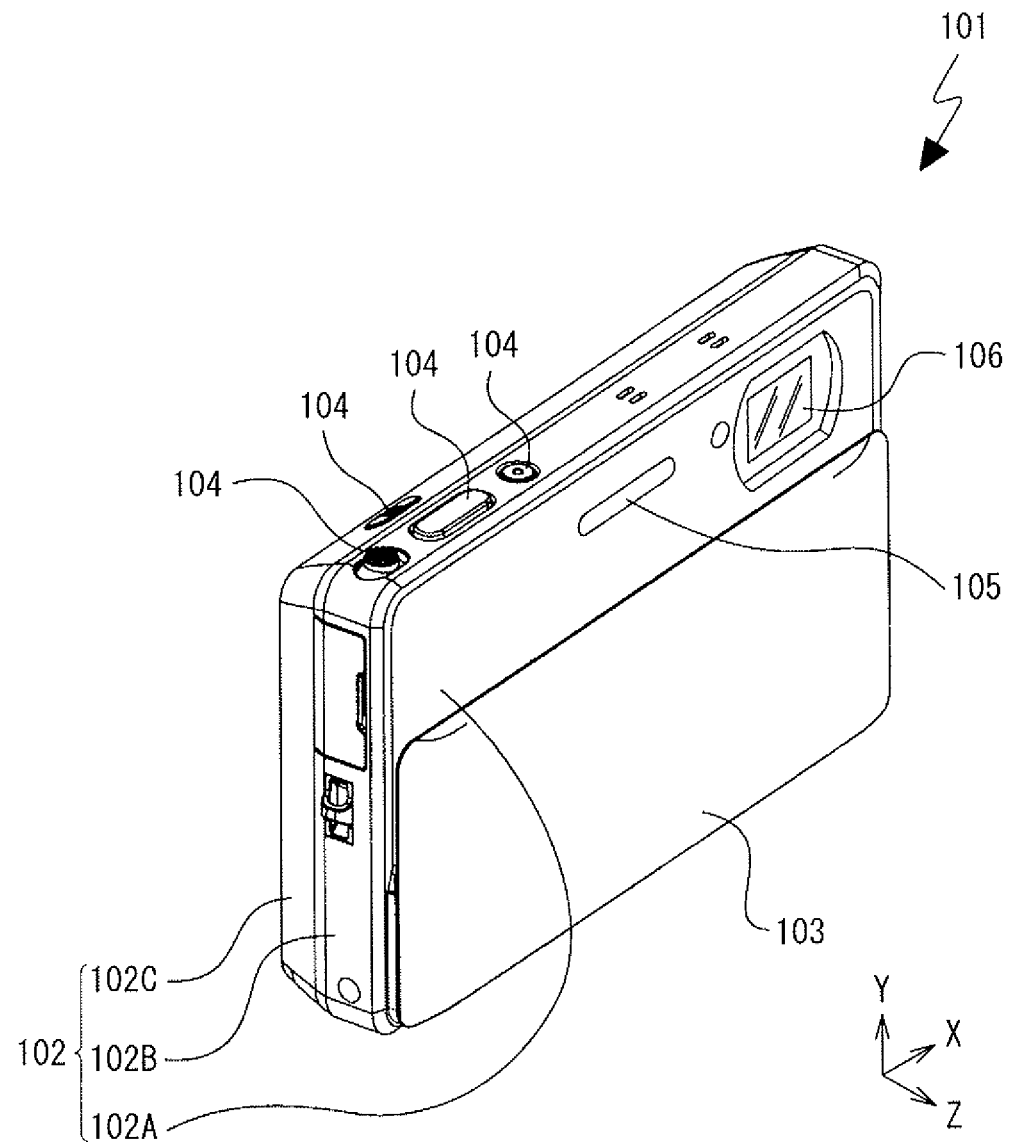

[Fig. 45]
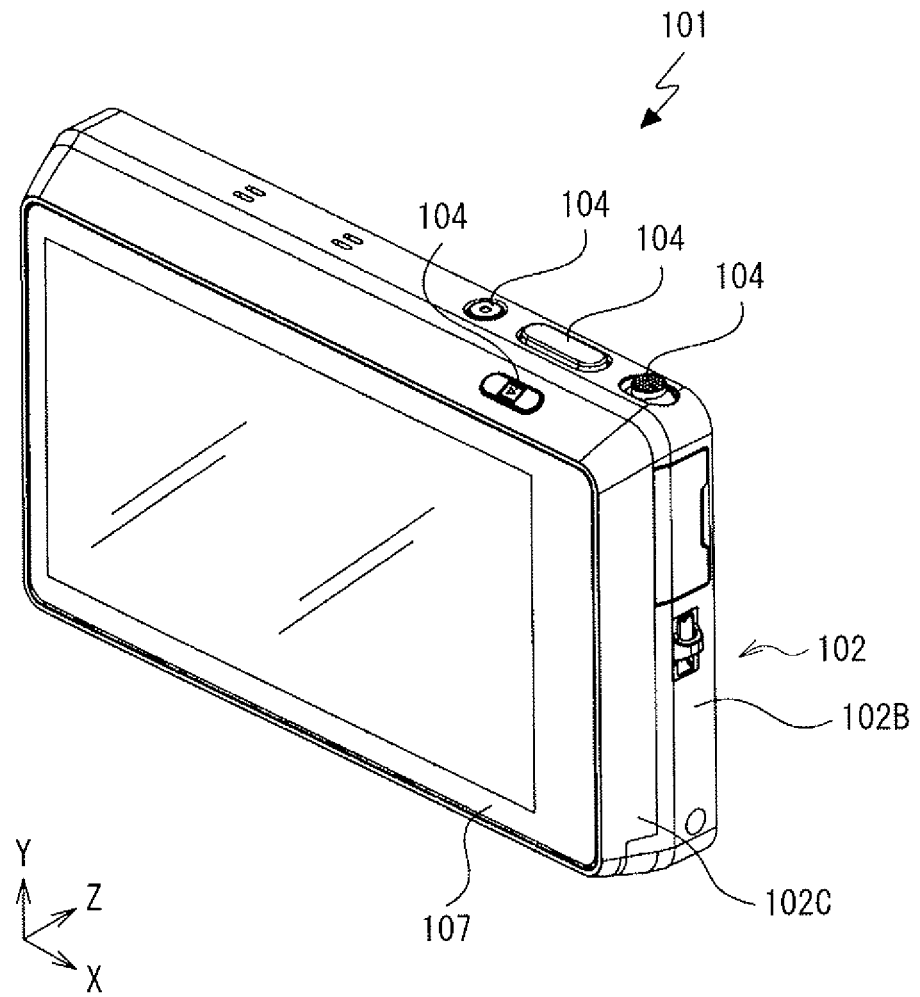

[Fig. 46]
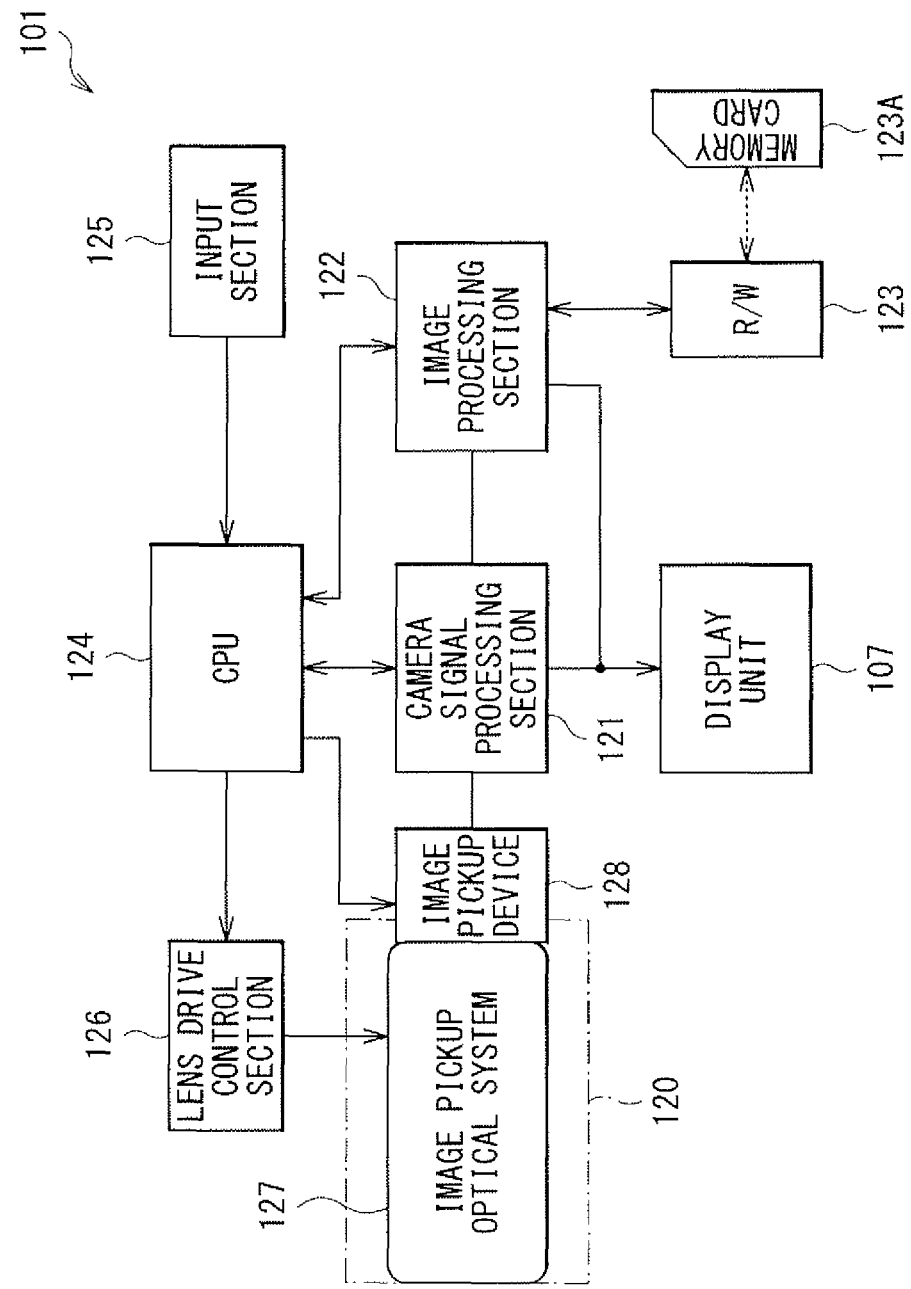

[Fig. 47]
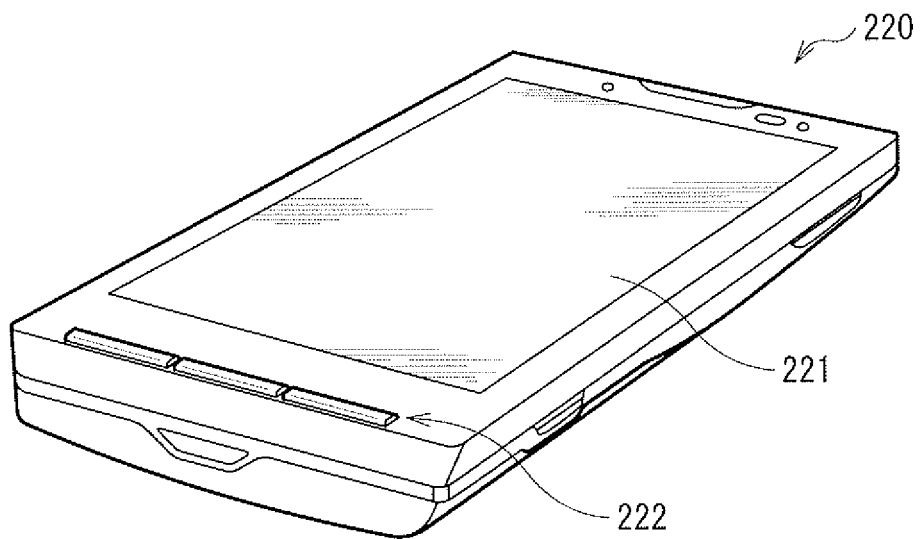
[Fig. 48]
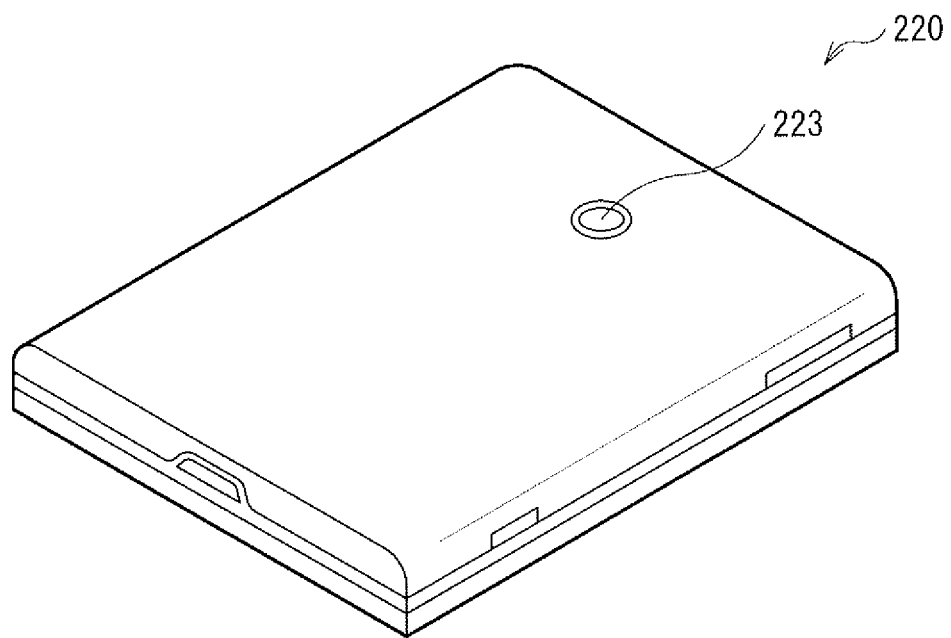

[Fig. 49]
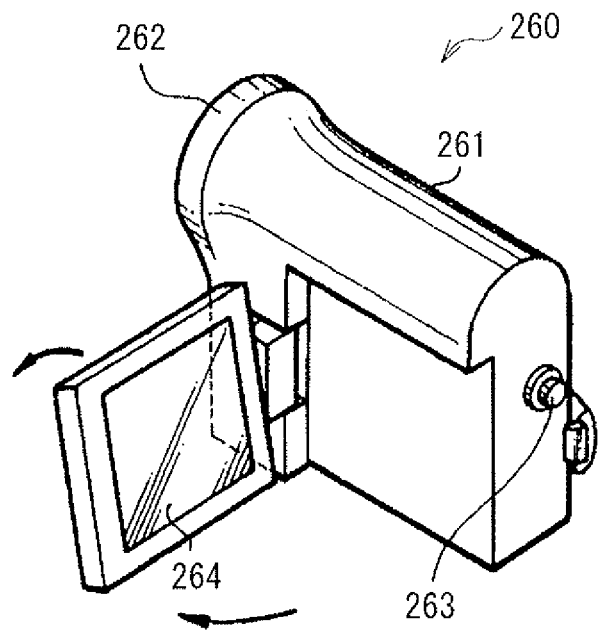
[Fig. 50]
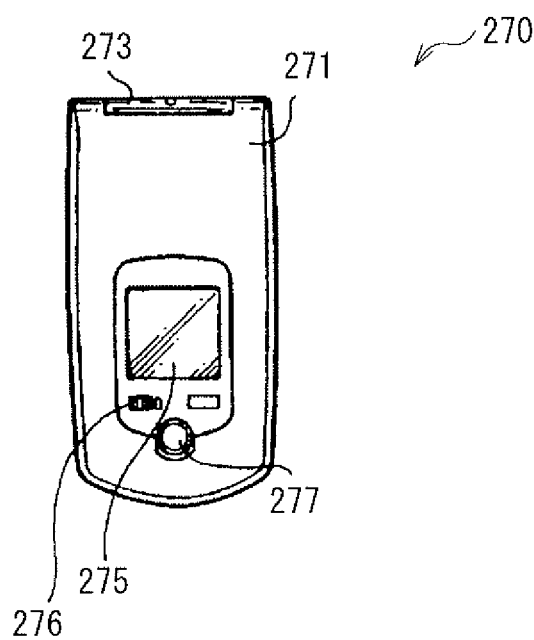

[Fig. 51]
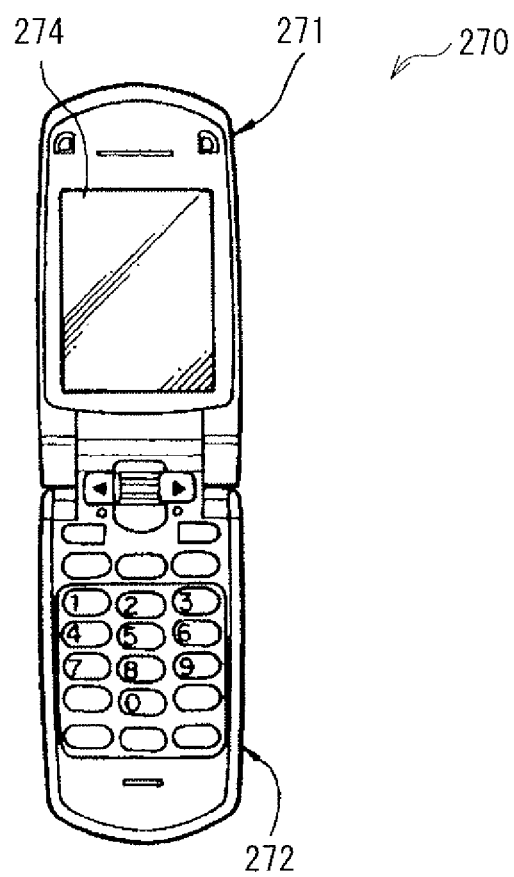

SOLID-STATE IMAGE PICKUP UNIT, METHOD OF MANUFACTURING THE SAME, AND ELECTRONIC APPARATUS

CROSS REFERENCE TO RELATED APPLICATIONS

This application is a national stage application under 35 U.S.C. 371 and claims the benefit of PCT Application No. PCT/JP2014/001805 having an international filing date of Mar. 27, 2014, which designated the United States, which PCT application claimed the benefit of Japanese Patent Application No. 2013-078831 filed Apr. 4, 2013, the disclosures of which are incorporated herein by reference in their entirety.

TECHNICAL FIELD

The present disclosure relates to a solid-state image pickup unit including a reflective plate on a side opposite to a light incident surface of a photoelectric conversion section, a method of manufacturing the same, and an electronic apparatus including the solid-state image pickup unit.

BACKGROUND ART

For example, a solid-state image pickup unit including a reflective plate on a side opposite to a light incident surface of a photoelectric conversion section is described in PTL 1. The reflective plate is configured to reflect light having passed through a silicon substrate and then to allow the light to enter the photoelectric conversion section again, thereby improving sensitivity.

CITATION LIST

Patent Literature

[PTL 1] Japanese Unexamined Patent Application Publication No. 2008-147333
[PTL 2] Japanese Unexamined Patent Application Publication No. 2011-91128

SUMMARY

Technical Problem

However, since a flat reflective plate is used in PTL 1, it is difficult to efficiently reflect light having passed through the silicon substrate to the photoelectric conversion section. Moreover, in a case where obliquely incident light has passed through the silicon substrate, the light reflected by the reflective plate enters an adjacent pixel, thereby causing issues such as occurrence of crosstalk between adjacent pixels.

Therefore, in PTL 2, it is proposed that a reflective plate has an arc-like concave sectional shape. However, etching control is difficult, thereby causing an issue of low shape uniformity of reflective plates in a chip or a wafer.

It is desirable to provide a solid-state image pickup unit including a concave-shaped reflective plate that has high shape uniformity and is capable of being allowed to be fabricated with a simple process, and a method of manufacturing the same.

Solution to Problem

According to an embodiment of the present disclosure, there is provided a solid-state image pickup unit including: a first member including a photoelectric conversion section; and a second member including a reflective plate with a concave surface section, the second member being bonded to a surface opposite to a light incident surface of the first member to allow the concave surface section of the reflective plate to face the photoelectric conversion section.

In the solid-state image pickup unit according to the embodiment of the present disclosure, the second member including the reflective plate with the concave surface section is bonded to the surface opposite to the light incident surface of the first member; therefore, light having passed through the photoelectric conversion section is reflected by the concave surface section of the reflective plate to enter the photoelectric conversion section again, thereby reducing crosstalk to adjacent pixels.

According to an embodiment of the present disclosure, there is provided a method of manufacturing a solid-state image pickup unit, the method including: forming a photoelectric conversion section on a first semiconductor substrate to form a first member; forming a reflective plate with a concave surface section on a second semiconductor substrate to form a second member; and bonding the second member to a surface opposite to a light incident surface of the first member to allow the concave surface section of the reflective plate to face the photoelectric conversion section.

According to an embodiment of the present disclosure, there is provided an electronic apparatus provided with a solid-state image pickup unit, the solid-state image pickup unit including: a first member including a photoelectric conversion section; and a second member including a reflective plate with a concave surface section, the second member being bonded to a surface opposite to a light incident surface of the first member to allow the concave surface section of the reflective plate to face the photoelectric conversion section.

In the solid-state image pickup unit according to the embodiment of the present disclosure, the method of manufacturing the solid-state image pickup unit according to the embodiment of the present disclosure, or the electronic apparatus according to the embodiment of the present disclosure, the first member including the photoelectric conversion section and the second member including the reflective plate with the concave surface section are bonded together. Therefore, the second member including the reflective plate with the concave surface section is allowed to be formed by a simple process without using difficult etching control, and shape uniformity of the reflective plate is allowed to be enhanced.

It is to be understood that both the foregoing general description and the following detailed description are exemplary, and are intended to provide further explanation of the technology as claimed.

BRIEF DESCRIPTION OF DRAWINGS

FIG. 1 is a sectional view illustrating a configuration of a solid-state image pickup unit according to a first embodiment of the present disclosure.

FIG. 2 is a sectional view illustrating a process of a method of manufacturing the solid-state image pickup unit illustrated in FIG. 1.

FIG. 3 is a sectional view illustrating a process following FIG. 2.

FIG. 4 is a sectional view illustrating a process following FIG. 3.

FIG. 5 is a sectional view illustrating a process following FIG. 4.

FIG. 6 is a sectional view illustrating a process following FIG. 5.

FIG. 7 is a sectional view illustrating a process following FIG. 6.

FIG. 8 is a sectional view illustrating a process following FIG. 7.

FIG. 9 is a sectional view illustrating a process following FIG. 8.

FIG. 10 is a sectional view illustrating a process following FIG. 9.

FIG. 11 is a sectional view illustrating a process following FIG. 10.

FIG. 12 is a sectional view for describing a method of controlling a recessed amount of a concave surface section illustrated in FIG. 5.

FIG. 13 is a sectional view for describing the method of controlling the recessed amount of the concave surface section.

FIG. 14 is a sectional view illustrating an example of an existing reflective plate.

FIG. 15 is a sectional view illustrating another example of the existing reflective plate.

FIG. 16 is a plan view illustrating a planar configuration of a reflective plate according to Modification Example 1.

FIG. 17 is a plan view illustrating a planar configuration of a reflective plate according to Modification Example 2.

FIG. 18 is a plan view illustrating a planar configuration of a reflective plate according to Modification Example 3.

FIG. 19 is a plan view illustrating a planar configuration of a reflective plate according to Modification Example 4.

FIG. 20 is a sectional view illustrating a configuration of a solid-state image pickup unit according to a second embodiment of the present disclosure.

FIG. 21 is a sectional view illustrating a process of a method of manufacturing the solid-state image pickup unit illustrated in FIG. 20.

FIG. 22 is a sectional view illustrating a process following FIG. 21.

FIG. 23 is a sectional view illustrating a process following FIG. 22.

FIG. 24 is a sectional view illustrating a process following FIG. 23.

FIG. 25 is a sectional view illustrating a process following FIG. 24.

FIG. 26 is a sectional view illustrating a process following FIG. 25.

FIG. 27 is a sectional view illustrating a process following FIG. 26.

FIG. 28 is a sectional view illustrating a process following FIG. 27.

FIG. 29 is a sectional view illustrating a process following FIG. 28.

FIG. 30 is a sectional view illustrating a process following FIG. 29.

FIG. 31 is a sectional view illustrating a process following FIG. 30.

FIG. 32 is a sectional view illustrating a process following FIG. 31.

FIG. 33 is a sectional view illustrating a process following FIG. 32.

FIG. 34 is a sectional view illustrating a process following FIG. 33.

FIG. 35 is a sectional view illustrating a process following FIG. 34.

FIG. 36 is a sectional view illustrating a configuration of a solid-state image pickup unit according to a third embodiment of the present disclosure.

FIG. 37 is a sectional view illustrating a configuration of a solid-state image pickup unit according to a fourth embodiment of the present disclosure.

FIG. 38 is a sectional view illustrating a configuration of a solid-state image pickup unit according to a fifth embodiment of the present disclosure.

FIG. 39 is a plan view of the solid-state image pickup unit illustrated in FIG. 38.

FIG. 40 is a sectional view illustrating a configuration of a solid-state image pickup unit according to a sixth embodiment of the present disclosure.

FIG. 41 is a sectional view illustrating a configuration of a solid-state image pickup unit according to a seventh embodiment of the present disclosure.

FIG. 42 is a sectional view illustrating a configuration of a solid-state image pickup unit according to an eighth embodiment of the present disclosure.

FIG. 43 is a perspective view illustrating an appearance of a digital still camera according to Application Example 1 of any of the embodiments of the present disclosure in a state in which an open-close panel is closed.

FIG. 44 is a perspective view illustrating an appearance of the digital still camera illustrated in FIG. 43 in a state in which the open-close panel is opened.

FIG. 45 is a perspective view illustrating an appearance of the digital still camera illustrated in FIG. 43 when viewed from a different direction.

FIG. 46 is a block diagram illustrating a circuit configuration of the digital still camera illustrated in FIG. 43.

FIG. 47 is a perspective view illustrating an appearance of Application Example 2 when viewed from a front side.

FIG. 48 is a perspective view illustrating an appearance of Application Example 2 when viewed from a back side.

FIG. 49 is a perspective view illustrating an appearance of Application Example 3.

FIG. 50 is a front view illustrating an appearance of Application Example 4 in a close state.

FIG. 51 is a front view illustrating an appearance of Application Example 4 in an open state.

DESCRIPTION OF EMBODIMENTS

Some embodiments of the present disclosure will be described in detail below referring to the accompanying drawings. It is to be noted that description will be given in the following order.

1. First Embodiment (An example in which a first member includes a photoelectric conversion section and a metal wiring layer and a second member includes a reflective plate)
2. Modification Examples 1 to 4 (Modification examples of a planar configuration of the reflective plate)
3. Second Embodiment (An example in which a part of the metal wiring layer is disposed in the second member)
4. Third Embodiment (An example in which an active device configuring a peripheral circuit is included in the second member)
5. Fourth Embodiment (An example of twin contact type)
6. Fifth Embodiment (An example in which a reflective plate located below a blue filter is not included, and a metal wiring layer is concentrated to serve as a connection section)
7. Sixth Embodiment (An example in which two photoelectric conversion sections are laminated below a green filter and a magenta filter)

8. Seventh Embodiment (An example in which three photoelectric conversion sections are laminated)
9. Eighth Embodiment (An example in which an organic photoelectric conversion section and an inorganic photoelectric conversion section are combined together)
10. Application Examples (Electronic apparatuses)

First Embodiment

FIG. 1 illustrates a sectional configuration of a solid-state image pickup unit according to a first embodiment of the present disclosure. A solid-state image pickup unit 1 is used for an electronic apparatus such as a camera, and has a configuration in which a first member 10 and a second member 20 are bonded together at a bonding interface 30. The first member 10 serves as an image sensor substrate including a photoelectric conversion section 11. The second member 20 serves as a reflective plate formation substrate including a reflective plate 20 with a concave surface section 21A. The second member 20 is bonded to a surface opposite to a light incident surface 10A of the first member 10 to allow the concave surface section 21A of the reflective plate 21 to face the photoelectric conversion section 11. Thus, the solid-state image pickup unit 1 is allowed to include the concave-shaped reflective plate 21 that has high shape uniformity and is capable of being fabricated by a simple process.

The first member 10 may include, for example, insulating films 12A and 12B, a gate electrode 13, a first metal wiring layer 41, and a second metal wiring layer 42 below the photoelectric conversion section 11 in this order from a side closer to the photoelectric conversion section 11. A microlens 15 is disposed above the photoelectric conversion section 11 with an interlayer insulating film 14 in between.

The second member 20 may include, for example, an insulating film 22A, the reflective plate 21, and an insulating film 22B in this order on a semiconductor substrate, for example, a silicon (Si) substrate 23.

The photoelectric conversion section 11 may be an inorganic photoelectric conversion section configured of a photodiode having a p-n junction. The photoelectric conversion section 11 is disposed in a semiconductor layer 17 grown on a semiconductor substrate, for example, a silicon substrate 16 (not illustrated in FIG. 1, refer to FIG. 8). It is to be noted that, in FIG. 1, the photoelectric conversion section 11 is abstractly illustrated, and a configuration of the photoelectric conversion section 11 is not specifically limited thereto.

The insulating films 12A and 12B are disposed below the photoelectric conversion section 11, and each of the insulating films 12A and 12B may be configured of, for example, a silicon oxide film ($SiO_2$).

The gate electrode 13 is configured to transfer a signal charge from the photoelectric conversion section 11, and configures a transfer transistor with a source and a drain (both not illustrated).

The first metal wiring layer 41 and the second metal wiring layer 42 are configured to perform driving of the photoelectric conversion section 11, signal transmission, voltage application to respective components, and the like, and are disposed in the insulating film 12B. It is to be noted that a case where two layers, i.e., the first metal wiring layer 41 and the second metal wiring layer 42 are provided as metal wiring layers is illustrated in FIG. 1; however, the number of laminated metal wiring layers and configurations of the metal wiring layers are not specifically limited thereto.

The interlayer insulating film 14 may be configured of, for example, a silicon oxide film (Sift). The microlens 15 is configured to focus light incident from above the microlens 15 on a light reception surface of the photoelectric conversion section 11.

The reflective plate 21 is configured to reflect light L1 having passed through the first member 10 to return the light L1 to the photoelectric conversion section 11, thereby improving sensitivity. The reflective plate 21 may preferably have a concave surface section 21A in a top surface thereof (a side closer to the photoelectric conversion section 11) and a flat section 21B in a bottom surface thereof. As will be described later, such a concave surface section 21A is formed by dishing a metal material film embedded in a groove section 24A of the insulating film 22A by a chemical mechanical polishing method. The reflective plate 21 may be preferably made of, for example, one or more kinds selected from a group configured of copper, aluminum, alloys including copper, and alloys including aluminum.

Each of the insulating films 22A and 22B may be configured of, for example, a silicon oxide film ($SiO_2$).

The solid-state image pickup unit 1 may be manufactured by the following processes.

FIGS. 2 to 11 illustrate the method of manufacturing the solid-state image pickup unit 1 in order of process. First, the reflective plate 21 having the concave surface section 21A is formed on the second semiconductor substrate, for example, the silicon substrate 23 to form the second member 20.

More specifically, first, as illustrated in FIG. 2, the insulating film 22A made of the above-described material is formed on the silicon substrate 23.

Next, as illustrated in FIG. 3, the groove section 24A for formation of the reflective plate 21 is formed in the insulating film 22A by, for example, photolithography and etching. The groove section 24A has a flat bottom surface.

Then, as illustrated in FIG. 4, a metal material film 25A is formed on a top surface of the insulating film 22A and in the groove section 24A. As the metal material film 25A, for example, copper may be deposited by a plating method. Moreover, before depositing copper by the plating method, a tantalum film serving as a barrier metal or copper serving as a seed film in plating may be formed on the top surface of the insulating film 22A and in the groove section 24A by sputtering (not illustrated).

After that, the metal material film 25A is polished by a chemical mechanical polishing method (CMP) to remove the metal material film 25A other than a portion embedded in the groove section 24A of the metal material film 25A. Thus, as illustrated in FIG. 5, the reflective plate 21 is formed. At this time, a top surface of the reflective plate 21 is recessed in an arc-like sectional shape to serve as the concave surface section 21A. A bottom surface of the reflective plate 21 is maintained flat, based on the flat bottom surface of the groove section 24A to serve as the flat section 21B.

In other words, when overpolishing is performed in a state in which the metal material film 25A other than the portion embedded in the groove section 24A of the metal material film 25A is removed, the top surface of the reflective plate 21 is recessed by a phenomenon called "dishing". The reflective plate 21 having the concave surface section 21A with a desired shape is allowed to be formed by appropriately setting an overpolishing amount.

After the reflective plate 21 is formed, as illustrated in FIG. 6, the insulating film 22B made of the above-described material is formed on the insulating film 22A and the reflective plate 21. At this time, in some cases, a silicon nitride film, a silicon carbide film, a silicon nitride carbide film, or the like may be formed on the reflective plate 21 as a diffusion prevention film configured to inhibit diffusion of the material used for the reflective plate 21 to the insulating film 22B, but is not illustrated in the drawing.

Next, as illustrated in FIG. 7, a top surface of the insulating film 22B is planarized by, for example, a CMP method. Thus, the second member 20 is formed.

On the other hand, as illustrated in FIG. 8, the photoelectric conversion section 11 is formed on a first semiconductor substrate, for example, the silicon (Si) substrate 16 to form the first member 10.

More specifically, the semiconductor layer 17 is grown on the silicon substrate 16, and the photoelectric conversion section 11 is formed in the semiconductor layer 17. Next, the insulating film 12A is formed on the semiconductor layer 17. Then, the gate electrode 13, the insulating film 12B, the first metal wiring layer 41, and the second metal wiring layer 42 are formed on the insulating film 12A. Thus, the first member 10 is formed.

After that, continuing with FIG. 8, the second member 20 is bonded to a surface opposite to the light incident surface 10A of the first member 10 so as to allow the concave surface section 21A of the reflective plate 21 to face the photoelectric conversion section 11. As a bonding method, for example, a surface activated bonding method by plasma irradiation may be used.

Next, as illustrated in FIG. 9, the silicon substrate 16 of the first member 10 is removed by, for example, a grinding method.

After that, as illustrated in FIG. 10, the interlayer insulating film 14 is formed on the photoelectric conversion section 11. Next, as illustrated in FIG. 11, the microlens 15 is disposed on the interlayer insulating film 14. Thus, the solid-state image pickup unit 1 illustrated in FIG. 1 is completed.

FIGS. 12 and 13 are diagrams for describing a method of controlling a recessed amount of the concave surface section 21A, and illustrate a relationship between dimensions of the groove section 24 and the insulating film 22A adjacent thereto and the recessed amount of the concave surface section 21A. As illustrated in FIG. 12, in a case where a ratio of a width W1 of the insulating film 22A to a width W2 of the groove section 24A is larger, a recessed amount D of the concave surface section 21A is smaller. On the other hand, as illustrated in FIG. 13, the narrower the width W1 of the insulating film 22A is, the more the recessed amount D of the concave surface section 21A is increased. The reflective plate 21 with a desired curvature is allowed to be formed by optimizing a dimension ratio W2:W1 between the groove section 24A and the insulating film 22A, depending on a size of a single pixel or a distance between the reflective plate 21 and the photoelectric conversion section 11. Moreover, the solid-state image pickup unit 1 with less variation in sensitivity is allowed to be obtained by enhancing controllability of the recessed amount D.

In this case, the dimension W1 of the insulating film 22A may be preferably ⅓ (one third) or less of the dimension W2 of the groove section 24A, because when the dimension ratio W2:W1 between the groove section 24A and the insulating film 22A is greater than 3:1, a dimension ratio of the groove section 24A is increased, thereby greatly accelerating dishing.

In this solid-state image pickup unit 1, when the light L1 enters the photoelectric conversion section 11 through the microlens 15, the light L1 passes through the photoelectric conversion section 11, and is photoelectrically converted during passage therethrough. In this case, since the second member 20 including the reflective plate 21 with the concave surface section 21A is bonded to the surface opposite to the light incident surface 10A of the first member 10, the light L1 having passed through the photoelectric conversion section 11 is reflected by the concave surface section 21A of the reflective plate 21, and reflected light L2 enters the photoelectric conversion section 11 again, thereby reducing crosstalk to adjacent pixels.

It is to be noted that, in a case where the flat reflective plate 21 is formed as illustrated in FIG. 14, a process of bonding the first member 10 and the second member 20 together is not necessary, and after the photoelectric conversion section 11 is formed on the silicon substrate 16, the insulating film 12A, the gate electrode 13, the insulating film 12B, the reflective plate 21, the first metal wiring layer 41, and the second metal wiring layer 42 may be laminated in order. However, in this case, it is difficult to efficiently reflect the light L1 having passed through the silicon substrate 16 to the photoelectric conversion section 11. Moreover, in a case where obliquely incident light has passed through the silicon substrate 16, reflected light may enter an adjacent pixel, thereby causing crosstalk between adjacent pixels.

Moreover, as illustrated in FIG. 15, for example, the following method may be considered to form the reflective plate 21 with an arc-like sectional shape without performing the process of bonding the first member 10 and the second member 20 together. In this method, the photoelectric conversion section 11 is formed on the silicon substrate 16 and is coated with the insulating film 12A. Next, a base layer 12C is formed on the insulating film 12A, and the base layer 12C is formed in a dome shape by etching, and a metal material layer that is to be the reflective plate 21 is formed on the base layer 12C. However, in this method, it is difficult to control etching for forming the base layer 12C in the dome shape, and nonuniformity in shape of the reflective plate 21 in a chip or a wafer is caused, thereby leading to sensitivity variation.

On the other hand, in this embodiment, the first member 10 including the photoelectric conversion section 11 and the second member including the reflective plate 21 with the concave surface section 21A are bonded together at the bonding interface 30. Therefore, the second member 20 including the reflective plate 21 with the concave surface section 21A is allowed to be formed without using difficult etching control by a simple process, i.e., dishing by overpolishing in the CMP, and shape uniformity of the reflective plate 21 is allowed to be enhanced.

Thus, in this embodiment, the first member 10 including the photoelectric conversion section 11 and the second member 20 including the reflective plate 21 with the concave surface section 21A are bonded together at the bonding interface 30. Therefore, the second member 20 including the reflective plate 21 with the concave surface section 21A is allowed to be formed without using difficult etching control by a simple process, i.e., dishing by overpolishing in the CMP. Thus, the solid-state image pickup unit 1 in which sensitivity characteristics are high and crosstalk is reduced is allowed to be obtained. Moreover, shape uniformity of the reflective plate 21 is allowed to be enhanced, and sensitivity variation is allowed to be reduced.

Further, since the concave surface section 21A of the reflective plate 21 is formed with use of a dishing phenomenon by chemical mechanical polishing of the metal material film 25A, controllability of the recessed amount D is allowed to be enhanced by appropriately setting the width W2 of the groove section 24A, and the solid-state image pickup unit 1 with less sensitivity variation is allowed to be obtained.

Modification Examples 1 to 4

FIGS. 16 to 19 illustrate Modification Examples 1 to 4 of a planar configuration of the reflective plate 21. FIGS. 16 to 18 illustrate a case where a unit pixel region PXL has a square shape, and FIG. 19 illustrates a case where the unit pixel region PXL has a rectangular shape.

Modification Example 1

For example, as illustrated in FIG. 16, the reflective plate 21 may have a rectangular planar shape. The recessed amount D of the concave surface section 21A is allowed to be controlled by appropriately setting the dimension ratio W2:W1 between the reflective plate 21 and the insulating film 22A, as described above.

Modification Example 2

Moreover, for example, as illustrated in FIG. 17, the reflective plate 21 may have a circular planar shape. Also in this modification example, the recessed amount D of the concave surface section 21A is allowed to be controlled by appropriately setting the dimension ratio W2:W1 between the reflective plate 21 and the insulating film 22A, as described above. Further, even if a light incident direction is changed, reflectivity is allowed to be kept constant by forming the planar shape of the reflective plate 21 in a circular shape, and dependence of sensitivity on a direction angle of incident light is allowed to be reduced.

Modification Example 3

Alternatively, for example, as illustrated in FIG. 18, the reflective plate 21 may have an octagonal planar shape. In this modification example, compared to the circular shape, a region occupied by the insulating film 22A in a unit pixel is reduced, and there is an advantage that, while dependence on the direction angle is reduced, sensitivity by reflected light is allowed to be enhanced.

It is to be noted that the planar shape of the reflective plate 21 may have a configuration other than the examples illustrated in FIGS. 16 to 18, and although not illustrated, the planar shape of the reflective plate 21 may have a polygonal shape with more corners, or any given shape, as necessary.

Modification Example 4

For example, the above-described Modification Examples 1 to 3 are applied to a case where a square pixel is used; however, for example, as illustrated in FIG. 19, the embodiment of the present disclosure is applicable to a case where a rectangular pixel is used. In this case, the recessed amount D of the concave surface section 21A is allowed to be controlled by appropriately setting a horizontal dimension ratio W2H:W1H and a vertical dimension ratio W2V:W1V between the reflective plate 21 and the insulating film 22A, as described above.

Second Embodiment

FIG. 20 illustrates a sectional configuration of a solid-state image pickup unit 1A according to a second embodiment of the present disclosure. In this embodiment, a part of the metal wiring layer configured to perform driving of the photoelectric conversion section 11 or signal transmission is disposed in the second member 20. The solid-state image pickup unit 1A has a configuration, functions, and effects similar to those in the above-described first embodiment, except for this point. Therefore, like components will be described with like reference numerals.

As with the first embodiment, the solid-state image pickup unit 1A includes the first member 10 including the photoelectric conversion section 11 and the second member 20 including the reflective plate 21 with the concave surface section 21A. As with the first embodiment, the second member 20 is bonded to the surface opposite to the light incident surface 10A of the first member 10 so as to allow the concave surface section 21A of the reflective plate 21 to face the photoelectric conversion section 11. Thus, as with the first embodiment, the solid-state image pickup unit 1A is allowed to include the concave-shaped reflective plate 21 that has high shape uniformity and is capable of being fabricated by a simple process.

The first member 10 may include, for example, the insulating films 12A and 12B, the gate electrode 13, and a third metal wiring layer 45 below the photoelectric conversion section 11 in this order from a side closer to the photoelectric conversion section 11. The microlens 15 is disposed above the photoelectric conversion section 11 with the interlayer insulating film 14 in between.

The second member 20 may include, for example, an insulating film 22C, a first metal wiring layer 43, an insulating film 22D, the reflective plate 21, a second metal wiring layer 44, and an insulating film 22E in this order on the silicon substrate 23.

The photoelectric conversion section 11, the insulating films 12A and 12B, the gate electrode 13, the interlayer insulating film 14, and the microlens 15 are configured in a similar fashion to the first embodiment.

As with the first embodiment, the reflective plate 21 may preferably have the concave surface section 21A in the top surface thereof (the side closer to the photoelectric conversion section 11) and the flat section 21B in the bottom surface thereof. As will be described later, the concave surface section 21A is formed by dishing a metal material film 25C embedded in a groove section 24D of the insulating film 22D by a chemical mechanical polishing method. As with the first embodiment, the reflective plate 21 may be preferably made of one or more kinds selected from a group configured of copper, aluminum, alloys including copper, and alloys including aluminum.

The first to third metal wiring layers 43 to 45 are configured to perform driving of the photoelectric conversion section 11, signal transmission, voltage application to respective components, and the like. The third metal wiring layer 45 is included in the first member 10. The first metal wiring layer 43 and the second metal wiring layer 44 are included in the second member 20. It is to be noted that the number of laminated metal wiring layers and configurations of the metal wiring layers are not specifically limited.

The reflective plate 21 may be preferably configured of a same metal material film as a metal material film configuring the second metal wiring layer 44, because the reflective plate 21 and the second metal wiring layer 44 are allowed to be fabricated by a same process.

Each of the insulating films 22C to 22E may be configured of, for example, a silicon oxide film (Sift).

The third metal wiring layer 45 is disposed in the insulating film 12B. The first metal wiring layer 43, the second metal wiring layer 44, and the reflective plate 21 are disposed in the insulating films 22C to 22E. The first metal wiring layer 43 and the second metal wiring layer 44 are connected to each other through a via 46. The second metal wiring layer 44 and the third metal wiring layer 45 are connected to each other by allowing surfaces 44A and 45A thereof to be in contact with each other.

The solid-state image pickup unit 1A may be manufactured by, for example, the following processes.

FIGS. 21 to 35 illustrate a method of manufacturing the solid-state image pickup unit 1A in order of process. First, the reflective plate 21 having the concave surface section 21A is formed on the second semiconductor substrate, for example, the silicon substrate 23 to form the second member 20.

More specifically, first, as illustrated in FIG. 21, the insulating film 22C made of the above-described material is formed on the silicon substrate 23.

Next, as illustrated in FIG. 22, the groove section 24B for formation of the first metal wiring layer 43 is formed in the insulating film 22C by, for example, photolithography and etching.

Then, as illustrated in FIG. 23, a metal material film 25B is formed on a top surface of the insulating film 22C and in the groove section 24B. As the metal material film 25B, for example, copper may be deposited by a plating method. Moreover, before depositing copper by the plating method, a tantalum film serving as a barrier metal or copper serving as a seed film in plating may be formed on the top surface of the insulating film 22C and in the groove section 24B by sputtering (not illustrated).

After that, the metal material film 25B is polished by a chemical mechanical polishing method (CMP) to remove the metal material film 25B other than a portion embedded in the groove section 24B of the metal material film 25B. Thus, as illustrated in FIG. 24, the first metal wiring layer 43 is formed.

After the first metal wiring layer 43 is formed, as illustrated in FIG. 25, the insulating film 22D made of the above-described material is formed on the first metal wiring layer 43 and the insulating film 22C. At this time, a silicon nitride film, a silicon carbide film, a silicon nitride carbide film, or the like may be formed on the first metal wiring layer 43 as a diffusion prevention film configured to inhibit diffusion of the material used for the first metal wiring layer 43 to the insulating film 22D, but is not illustrated in the drawing.

Next, as illustrated in FIG. 26, a groove section 24C for formation of the second metal wiring layer 44 and a groove section 24D for formation of the reflective plate 21 are formed in the insulating film 22D by, for example, photolithography and etching. Each of the groove sections 24C and 24D has a flat bottom surface.

After that, as illustrated in FIG. 27, a via 24E is formed in the groove section 24C for formation of the second metal wiring layer 44. It is to be noted that, in this manufacturing method, a case where the via 24E is formed after the groove section 24C is formed is described; however, the via 24E may be formed first, and then the groove section 24C may be formed in a region including the via 24E.

Next, as illustrated in FIG. 28, the metal material film 25C is formed on a top surface of the insulating film 22D and in the groove sections 24C and 24D (including the via 24E). As the metal material film 25C, for example, copper may be deposited by a plating method. Moreover, before depositing copper by the plating method, a tantalum film serving as a barrier metal or copper serving as a seed film in plating may be formed on the top surface of the insulating film 22D and in the groove sections 24C and 24D (including the via 24E) by sputtering (not illustrated).

After that, the metal material film 25C is polished by the chemical mechanical polishing method (CMP) to remove the metal material film 25C other than portions embedded in the groove sections 24C and 24D (including the via 24E) of the metal material film 25C. Thus, as illustrated in FIG. 29, the reflective plate 21, the second metal wiring layer 44, the via 46 are formed. At this time, since a width of the groove section 24D is large, a top surface of the reflective plate 21 is recessed in an arc-like shape to form the concave surface section 21A. The bottom surface of the reflective plate 21 is maintained flat, based on the flat bottom surface of the groove section 24D to serve as the flat section 21B. Moreover, the first metal wiring layer 43 and the second metal wiring layer 44 are connected to each other through the via 46.

After the reflective plate 21 and the second metal wiring layer 44 are formed, as illustrated in FIG. 30, the insulating film 22E made of the above-described material is formed on the insulating film 22D, the second metal wiring layer 44, and the reflective plate 21.

Next, as illustrated in FIG. 31, a top surface of the insulating film 22E is planarized by, for example, a CMP method. At this time, a surface 44A of the second metal wiring layer 44 is exposed so as to make electrical connection to the third metal wiring layer 45 when bonding to the first member 10 later. The insulating film 22E is flatly deposited on the reflective plate 21. Thus, the second member 20 is formed.

On the other hand, as illustrated in FIG. 32, the photoelectric conversion section 11 is formed on the first semiconductor substrate, for example, the silicon (Si) substrate 16 to form the first member 10.

More specifically, the semiconductor layer 17 is grown on the silicon substrate 16, and the photoelectric conversion section 11 is formed in the semiconductor layer 17. Next, the insulating film 12A is formed on the semiconductor layer 17. Then, the gate electrode 13, the insulating film 12B, and the third metal wiring layer 45 are formed on the insulating film 12A. At this time, a surface 45A of the third metal wiring layer 45 is exposed so as to make electrical connection to the second metal wiring layer 44 when bonding to the second member 20 later. Thus, the first member 10 is formed.

After that, continuing with FIG. 32, the second member 20 is bonded to the surface opposite to the light incident surface 10A of the first member 10 so as to allow the concave surface section 21A of the reflective plate 21 to face the photoelectric conversion section 11. The third metal wiring layer 45 is formed in the first member 10, and is configured to be electrically connected to the second metal wiring layer 44 formed in the second member 20. The silicon substrate 16 is disposed on a side opposite to the bonding interface 30 of the first member 10.

Next, as illustrated in FIG. 33, the silicon substrate 16 of the first member 10 is removed.

After that, as illustrated in FIG. 34, the interlayer insulating film 14 is formed on the photoelectric conversion section 11. Next, as illustrated in FIG. 35, the microlens 15 is disposed on the interlayer insulating film 14. Thus, the solid-state image pickup unit 1A illustrated in FIG. 20 is completed.

In this solid-state image pickup unit 1A, as with the first embodiment, when the light L1 enters the photoelectric conversion section 11 through the microlens 15, the light L1 passes through the photoelectric conversion section 11, and is photoelectrically converted during passage therethrough. In this case, since the second member 20 including the reflective plate 21 with the concave surface section 21A is bonded to the surface opposite to the light incident surface 10A of the first member 10 as with the first embodiment, the light L1 having passed through the photoelectric conversion section 11 is reflected by the concave surface section 21A of the reflective plate 21, and reflected light L2 enters the photoelectric conversion section 11 again, thereby reducing crosstalk to adjacent pixels.

Moreover, since the first metal wiring layer 43 and the second metal wiring layer 44 are included in the second member 20, the reflective plate 21 is disposed close to the first member 10, thereby improving an effect of focusing the reflected light L2 by the reflective plate 21. In particular, the reflected light L2 when a light incident angle thereof is increased is more efficiently focused on the photoelectric conversion section 11, and a reduced amount of sensitivity when the light incident angle is increased is reduced.

Thus, in this embodiment, since, in addition to effects in the first embodiment, a part of the metal wiring layer configured to perform driving of the photoelectric conversion section 11 or signal transmission is disposed in the second member 20, a distance between the reflective plate 21 and the photoelectric conversion section 11 is allowed to be reduced, and focusing efficiency by the reflective plate 21 is allowed to be further enhanced.

Third Embodiment

FIG. 36 illustrates a sectional configuration of a solid-state image pickup unit 1B according to a third embodiment of the present disclosure. In this embodiment, a transistor configuring a peripheral circuit of the photoelectric conversion section 11 is included in the second member 20. The solid-state image pickup unit 1B has a configuration, functions, and effects similar to those in the above-described first and second embodiments, except for this point. Therefore, like components will be described with like reference numerals.

As with the first embodiment, the solid-state image pickup unit 1B includes the first member 10 including the photoelectric conversion section 11 and the second member including the reflective plate 21 with the concave surface section 21A. As with the first embodiment, the second member 20 is bonded to the surface opposite to the light incident surface 10A of the first member 10 so as to allow the concave surface section 21A of the reflective plate 21 to face the photoelectric conversion section 11. Thus, as with the first embodiment, the solid-state image pickup unit 1B is allowed to include the concave reflective plate 21 that has high shape uniformity and is capable of being fabricated by a simple process.

The first member 10 may include, for example, the insulating films 12A and 12B, the gate electrode 13, and the third metal wiring layer 45 below the photoelectric conversion section 11 in this order from a side closer to the photoelectric conversion section 11. The microlens 15 is disposed above the photoelectric conversion section 11 with the interlayer insulating film 14 in between.

The second member 20 may include, for example, a transistor 50, the insulating film 22C, the first metal wiring layer 43, the insulating film 22D, the reflective plate 21, the second metal wiring layer 44, and the insulating film 22E in this order on the silicon substrate 23.

The photoelectric conversion section 11, the insulating films 12A and 12B, the gate electrode 13, the interlayer insulating film 14, and the microlens 15 are configured in a similar fashion to the first embodiment.

The first to third metal wiring layers 43 to 45 and the insulating films 22C to 22E are configured in a similar fashion to the second embodiment. It is to be noted that the number of laminated metal wiring layers and configurations of the metal wiring layers are not specifically limited.

As with the first embodiment, the reflective plate 21 may preferably have the concave surface section 21A in the top surface thereof (on the side closer to the photoelectric conversion section 11) and the flat section 21B in the bottom surface thereof. As with the second embodiment, the concave surface section 21A is formed by dishing the metal material film 25C embedded in the groove section 24D of the insulating film 22D by a chemical mechanical polishing method. As with the first embodiment, the reflective plate 21 may be preferably made of, for example, one or more kinds selected from a group configured of copper, aluminum, alloys including copper, and alloys including aluminum.

As with the second embodiment, the reflective plate 21 may be preferably configured of a same metal material film as a metal material film configuring the second metal wiring layer 44, because the reflective plate 21 and the second metal wiring layer 44 are allowed to be fabricated by a same process.

The transistor 50 may be, for example, a device configuring a signal voltage output circuit, and includes a gate electrode 51, a gate insulating film 52, a source 53, and a drain 54. Such a device is typically included in the first substrate 10. It is to be noted that, although wiring connected to the gate electrode 51 is not illustrated in FIG. 36, the gate electrode 51 is electrically connected to the first metal wiring layer 43 by making contact with the first metal wiring layer 43, as necessary.

This solid-state image pickup unit 1B may be manufactured as with the second embodiment, except that the insulating film 22C is formed after forming the transistor 50 on the silicon substrate 23.

In this solid-state image pickup unit 1B, as with the first embodiment, when the light L1 enters the photoelectric conversion section 11 through the microlens 15, the light L1 passes through the photoelectric conversion section 11, and is photoelectrically converted during passage therethrough. In this case, since the second member 20 including the reflective plate 21 with the concave surface section 21A is bonded to the surface opposite to the light incident surface 10A of the first member 10 as with the first embodiment, the light L1 having passed through the photoelectric conversion section 11 is reflected by the concave surface section 21A of the reflective plate 21, and reflected light L2 enters the photoelectric conversion section 11 again, thereby reducing crosstalk to adjacent pixels.

Moreover, since the transistor 50 configuring the peripheral circuit of the photoelectric conversion section 11 is included in the second member 20, in a case where generation of a hot carrier occurs during operation of the transistor 50, emitted light is blocked by the reflective plate 21 without entering the first member 10 to suppress generation of a false signal.

Thus, in this embodiment, since, in addition to effects in the first and second embodiments, the transistor configuring the peripheral circuit of the photoelectric conversion section 11 is included in the second member 20, in a case where the generation of a hot carrier occurs during operation of the transistor 50, emitted light is allowed to be blocked by the reflective plate 21 without entering the first member 10 to suppress generation of a false signal.

It is to be noted that, in this embodiment, a case where a device configuring an output circuit of the photoelectric conversion section 11 is formed in the second member 20 is described; however, in addition to this device, a device having a function as a drive circuit of the photoelectric conversion section 11, a memory circuit configured to hold an output signal from the photoelectric conversion section 11, or a signal processing circuit configured to process a signal charge and to reproduce an image may be formed. Moreover, a combination of any of the drive circuit, the output circuit, the signal processing circuit, and the memory circuit may be included in the second member 20.

Fourth Embodiment

FIG. 37 illustrates a sectional configuration of a solid-state image pickup unit 1C according to a fourth embodiment of the present disclosure. This embodiment has a configuration, functions, and effects similar to those in the above-described third embodiment, except that a connection configuration between the third metal wiring layer 45 of the first member 10 and the second metal wiring layer 44 of the second member 20 is different from that in the third embodiment. Therefore, like components will be described with like reference numerals.

This solid-state image pickup unit 1C has an image pickup region 1C1 and a peripheral region 1C2. A configuration of the image pickup region 1C1 is similar to that in the solid-state image pickup unit 1B according to the third embodiment. A connection section 60 is included in the peripheral region 1C2.

The connection section 60 is configured to electrically connect the first member 10 and the second member 20 to each other, and has a so-called twin contact configuration configured of a first through hole via 61, a second through hole via 62, and a metal film 63. The first through hole via 61 penetrates through the semiconductor layer 17 in a vertical direction in the first member 10 to reach the third metal wiring layer 45. The second through hole via 62 penetrates through the first member 10 in the vertical direction to reach the second metal layer 44 in the second member 20. The metal film 63 couples the first through hole via 61 and the second through hole via 62 together to electrically connect the third metal wiring layer 45 and the second metal wiring layer 44 to each other. For example, in FIG. 37, a case where the metal film 63 is disposed between interlayer insulating films 14A and 14B is illustrated; however, the metal film 63 may be disposed in any other position.

This solid-state image pickup unit 1C may be manufactured by, for example, the following processes.

First, as with the third embodiment, the first member 10 including the photoelectric conversion section 11 and the second member 20 including the reflective plate 21 are formed, and the first member 10 and the second member 20 are bonded together at the bonding interface 30. At this time, the second metal wiring layer 44 and the third metal wiring layer 45 are extended so as to be formed not only in the image pickup region 1C1 but also in the peripheral region 1C2.

Next, the silicon substrate 16 is removed, and then the interlayer insulating film 14A is formed. Then, the first through hole via 61 and the second through hole via 62 are pierced in the peripheral region 1C2. After that, a metal material film is formed on the interlayer insulating film 14A to form the metal film 63 by, for example, photolithography and etching, and the second metal wiring layer 44 and the third metal wiring layer 45 are connected to each other by the connection section 60. Next, the interlayer insulating film 14B is formed, and the microlens 15 is disposed in the image pickup region 1C1. Thus, the solid-state image pickup unit 1C illustrated in FIG. 37 is completed.

It is to be noted that, in FIG. 37, a case where connection between the first member 10 and the second member 20 is made only by the connection section 60 is illustrated. However, connection by the connection section 60 illustrated in FIG. 37 and connection by contact between the surfaces 44A and 45A of the second metal wiring layer 44 and the third metal writing layer 45 in each pixel illustrated in FIG. 36 may be adopted together.

Fifth Embodiment

FIG. 38 illustrates a sectional configuration of a solid-state image pickup unit 1D according to a fifth embodiment of the present disclosure. In this embodiment, while a green filter 70G, a red filter 70R, and a blue filter 70B are included in the first member 10, in the second member 20, the reflective plate 21 in a region facing the blue filter 70B is not included, and instead of the reflective plate 21, a connection section 47 configured to connect the first member 10 and the second member 20 to each other is included. This solid-state image pickup unit 1D has a configuration, functions, and effects similar to those in the above-described second embodiment, except for this point. Therefore, like components will be described with like reference numerals.

As with the first embodiment, the solid-state image pickup unit 1D includes the first member 10 including the photoelectric conversion section 11 and the second member including the reflective plate 21 with the concave surface section 21A. As with the first embodiment, the second member 20 is bonded to the surface opposite to the light incident surface 10A of the first member 10 so as to allow the concave surface section 21A of the reflective plate 21 to face the photoelectric conversion section 11. Thus, as with the first embodiment, the solid-state image pickup unit 1D is allowed to include the concave reflective plate 21 that has high shape uniformity and is capable of being fabricated by a simple process.

The first member 10 may include, for example, the insulating films 12A and 12B, the gate electrode 13, and the third metal wiring layer 45 below the photoelectric conversion section 11 in this order from a side closer to the photoelectric conversion section 11. The green filter 70G, the red filter 70R, and the blue filter 70B, and the microlens 15 are disposed above the photoelectric conversion section 11 with the interlayer insulating film 14 in between.

The second member 20 may include, for example, the insulating film 22C, the first metal wiring layer 43, the insulating film 22D, the reflective plate 21, the second metal wiring layer 44, and the insulating film 22E in this order on the silicon substrate 23.

The photoelectric conversion section 11, the insulating films 12A and 12B, the gate electrode 13, the interlayer insulating film 14, and the microlens 15 are configured in a similar fashion to the first embodiment.

The green filter 70G is configured to obtain a signal corresponding to a green wavelength region from the photoelectric conversion section 11. The red filter 70R is configured to obtain a signal corresponding to a red wavelength region from the photoelectric conversion section 11. The blue filter 70B is configured to obtain a signal corresponding to a blue wavelength region from the photoelectric conversion section 11. It is to be noted that red (R) may be a color corresponding to a wavelength region from about 620 nm to about 750 nm both inclusive, green (G) may be a color corresponding to a wavelength region from about 495 nm to about 570 nm both inclusive, and blue (B) may be a color corresponding to a wavelength region from about 450 nm to about 495 nm both inclusive.

FIG. 39 illustrates an example of a planar arrangement of the green filter 70G, the red filter 70R, and the blue filter 70B. In this solid-state image pickup unit 1D, a plurality of square pixels are arranged in a matrix; however, in FIG. 39, two columns of pixels are illustrated. In a left column in FIG. 39, the green filters 70G and the blue filters 70B are alternately arranged in a column direction. In a right column in FIG. 39, the red filters 70R and the green filters 70G are alternately arranged in the column direction. The green filters 70G in the left column and the green filters 70G in the right column are arranged in a staggered fashion, and are not adjacent to each other. Although not illustrated, the left column and the right column in FIG. 39 are repeatedly arranged in a row direction.

The reflective plate 21 illustrated in FIG. 38 may preferably have the concave surface section 21A in the top surface thereof (on the side closer to the photoelectric conversion section 11) and the flat section 21B in the bottom surface thereof. As with the second embodiment, the concave surface section 21A is formed by dishing the metal material film 25C embedded in the groove section 24D of the insulating film 22D by a chemical mechanical polishing method. As with the first embodiment, the reflective plate 21 may be preferably made of, for example, one or more kinds selected from a group configured of copper, aluminum, alloys including copper, and alloys including aluminum.

Moreover, in this embodiment, the reflective plate 21 is provided to each of a region facing the green filter 70G and a region facing the red filter 70R, and is not provided to a region facing the blue filter 70B. Most of blue light with a short wavelength is absorbed while passing through the photoelectric conversion section 11 below the blue filter 70B, and has very little component passing through the photoelectric conversion section 11. On the other hand, each of light corresponding to green and light corresponding to red has a component passing through the photoelectric conversion section 11. Therefore, green light and red light are allowed to be reflected by the reflective plate 21 by providing the reflective plates 21 to only regions facing the photoelectric conversion section 11 below the green filter 70G and the red filter 70R, and the reflected light is allowed to be returned to the photoelectric conversion section 11 to be efficiently converted into a signal charge.

As with the second embodiment, the first to third metal wiring layer 43 to 45 are configured to perform driving of the photoelectric conversion section 11, signal transmission, voltage application to respective component, and the like. The third metal wiring layer 45 is included in the first member 10. The first metal wiring layer 43 and the second metal wiring layer 44 are included in the second member 20. It is to be noted that the number of laminated metal wiring layers and configurations of the metal wiring layers are not specifically limited.

The reflective plate 21 may be preferably configured of a same metal material film as a metal material film configuring the second metal wiring layer 44, because the reflective plate 21 and the second metal wiring layer 44 are allowed to be fabricated by a same process.

As with the second embodiment, the third metal wiring layer 45 is disposed in the insulating film 12B. As with the second embodiment, the first metal wiring layer 43, the second metal wiring layer 44, and the reflective plate 21 are disposed in the insulating films 22C to 22E. As with the second embodiment, the first metal wiring layer 43 and the second metal wiring layer 44 are connected to each other through the via 46. As with the second embodiment, the second metal wiring layer 44 and the third metal wiring layer 45 are connected to each other by allowing surfaces 44A and 45A thereof to be in contact with each other.

Moreover, in this embodiment, the first to third metal wiring layers 43 to 45 are concentrated on the region facing the blue filter 70B to form the connection section 47. Thus, the reflective plate 21 below the blue filter 70B is not included, and the first to third metal wiring layers 43 to 45 are concentrated on below the blue filter 70B to form the connection section 47; therefore, an area of the connection section 47 is allowed to be enlarged, and more reliable electrical connection between the first member 10 and the second member 20 are allowed to be made.

This solid-state image pickup unit 1D may be manufactured in a similar fashion to the second embodiment, except that the green filter 70G, the red filter 70R, and the blue filter 70B are included in the first member 10, and the connection section 47 is formed below the blue filter 70B in the second member 20.

Sixth Embodiment

FIG. 40 illustrates a sectional configuration of a solid-state image pickup unit 1E according to a sixth embodiment of the present disclosure. In this embodiment, while the green filter 70G and a magenta filter 70M that have a complementary color relationship therebetween are included in the first member 10, two photoelectric conversion sections 11 are laminated below each of the green filter 70G and the magenta filter 70M in the second member 20. The solid-state image pickup unit 1E has a configuration, functions, and effects similar to those in the above-described second embodiment, except for this point. Therefore, like components will be described with like reference numerals.

As with the first embodiment, the solid-state image pickup unit 1E includes the first member 10 including the photoelectric conversion sections 11 and the second member including the reflective plate 21 with the concave surface section 21A. As with the first embodiment, the second member 20 is bonded to the surface opposite to the light incident surface 10A of the first member 10 so as to allow the concave surface section 21A of the reflective plate 21 to face the photoelectric conversion sections 11. Thus, as with the first embodiment, the solid-state image pickup unit 1E is allowed to include the concave reflective plate 21 that has high shape uniformity and is capable of being fabricated by a simple process.

The first member 10 may include, for example, the insulating films 12A and 12B, the gate electrode 13, and the third metal wiring layer 45 below the photoelectric conversion sections 11 in this order from a side closer to the photoelectric conversion sections 11. The green filter 70G and the magenta filter 70M are disposed above the photoelectric conversion sections 11 with the interlayer insulating film 14 in between.

The second member 20 may include, for example, the insulating film 22C, the first metal wiring layer 43, the insulating film 22D, the reflective plate 21, the second metal wiring layer 44, and the insulating film 22E in this order on the silicon substrate 23.

The photoelectric conversion section 11, the insulating films 12A and 12B, the gate electrode 13, the interlayer insulating film 14, and the microlens 15 are configured in a similar fashion to the first embodiment.

The first to third metal wiring layers 43 to 45 and the insulating films 22C to 22E are configured in a similar fashion to the second embodiment. It is to be noted that the number of laminated metal wiring layers and configurations of the metal wiring layers are not specifically limited.

The green filter 70G is configured to obtain a signal corresponding to the green wavelength region by combining output signals of two photoelectric conversion sections 11. The magenta filter 70M is configured to obtain a signal corresponding to the blue wavelength region from the photoelectric conversion section 11 located closer to the light incident surface 10A, and to obtain a signal corresponding to the red wavelength region from the photoelectric conversion section 11 located farther from the light incident surface 10A.

As with the first embodiment, the reflective plate 21 is configured to reflect the light L1 having passed through the first member 10 to return the light L1 to the photoelectric conversion section 11, thereby improving sensitivity. In particular, in this embodiment, the reflective plate 21 reflects a component having passed through the photoelectric conversion sections 11 of light with a long wavelength, and allows the reflected component to enter the photoelectric conversion sections 11 again.

As metal wiring formed by a damascene method, copper is most popular. Reflection characteristics of copper include high reflectivity specifically with respect to light with a long wavelength. In a case where a laminate of the photoelectric conversion sections 11 is included, the photoelectric conversion section 11 configured to detect light with a long wavelength is disposed in a lower layer when viewed from the light incident surface 10. Therefore, it is effective to provide the reflective plate 21 made of copper with high reflectivity with respect to long-wavelength light to the photoelectric conversion section 11 in the lower layer when viewed from the light incident surface 10A. Bonding the first member including the laminate of the photoelectric conversion sections 11 to the second member 20 including the reflective plate 21 is highly effective to improve sensitivity.

As with the first embodiment, the reflective plate 21 may preferably have the concave surface section 21A in the top surface thereof (on the side closer to the photoelectric conversion section 11) and the flat section 21B in the bottom surface thereof. As with the second embodiment, the concave surface section 21A is formed by dishing the metal material film 25C embedded in the groove section 24D of the insulating film 22D by a chemical mechanical polishing method. As with the first embodiment, the reflective plate 21 may be preferably made of, for example, one or more kinds selected from a group configured of copper, aluminum, alloys including copper, and alloys including aluminum.

Moreover, as with the second embodiment, the reflective plate 21 may be preferably configured of a same metal material film as a metal material film configuring the second metal wiring layer 44, because the reflective plate 21 and the second metal wiring layer 44 are allowed to be fabricated by a same process.

In this solid-state image pickup unit 1E, when the light L1 enters the photoelectric conversion sections 11 through the microlens 15, the light L1 passes through the green filter 70G and the two photoelectric conversion sections 11 located below the green filter 70G or through the magenta filter 70M and the two photoelectric conversion sections 11 located below the magenta filter 70M, and each of red light, green light, and blue light is photoelectrically converted during passage therethrough. A signal corresponding to the green wavelength region is obtained by combining output signals of the two photoelectric conversion sections 11 located below the green filter 70G. A signal corresponding to the blue wavelength region is obtained from the photoelectric conversion section 11 located closer to the light incident surface 10A below the magenta filter 70M. A signal corresponding to the red wavelength region is obtained from the photoelectric conversion section 11 located farther from the light incident surface 10A below the magenta filter 70M.

In this case, since the second member 20 including the reflective plate 21 with the concave surface section 21A is bonded to the surface opposite to the light incident surface 10A of the first member 10, the light L1 having passed through the photoelectric conversion sections 11 is reflected by the concave surface section 21A of the reflective plate 21, and reflected light L2 enters the photoelectric conversion sections 11 again, thereby reducing crosstalk to adjacent pixels. In particular, in this embodiment, a component having passed through the photoelectric conversion sections 11 of light with a long wavelength is reflected by the reflective plate 21, and enters the photoelectric conversion sections 11 again. Therefore, sensitivity to red and green is particularly improved.

This solid-state image pickup unit 1E may be manufactured in a similar fashion to the second embodiment, except that the green filter 70G and the magenta filter 70M are included in the first member 10 and the two photoelectric conversion sections 11 are laminated below each of the green filter 70G and the magenta filter 70M.

Seventh Embodiment

FIG. 41 illustrates a sectional configuration of a solid-state image pickup unit 1F according to a seventh embodiment of the present disclosure. In this embodiment, three photoelectric conversion sections 11 are laminated for each pixel in the first member 10. The solid-state image pickup unit 1F has a configuration, functions, and effects similar to those in the above-described second embodiment, except for this point. Therefore, like components will be described with like reference numerals.

As with the first embodiment, the solid-state image pickup unit 1F includes the first member 10 including the photoelectric conversion section 11 and the second member including the reflective plate 21 with the concave surface section 21A. As with the first embodiment, the second member 20 is bonded to the surface opposite to the light incident surface 10A of the first member 10 so as to allow the concave surface section 21A of the reflective plate 21 to face the photoelectric conversion section 11. Thus, as with the first embodiment, the solid-state image pickup unit 1F is allowed to include the concave reflective plate 21 that has high shape uniformity and is capable of being fabricated by a simple process.

The first member 10 may include, for example, the insulating films 12A and 12B, the gate electrode 13, and the third metal wiring layer 45 below the photoelectric conversion sections 11 in this order from a side closer to the photoelectric conversion sections 11. The microlens 15 is disposed above the photoelectric conversion sections 11 with the interlayer insulating film 14 in between.

The second member 20 may include, for example, the insulating film 22C, the first metal wiring layer 43, the insulating film 22D, the reflective plate 21, the second metal wiring layer 44, and the insulating film 22E in this order on the silicon substrate 23.

Three photoelectric conversion sections 11 are laminated for each pixel. The three photoelectric conversion sections 11 laminated in order from a side closer to the light incident surface 10A are allowed to obtain respective signals corresponding to the blue wavelength region, the green wavelength region, and the red wavelength region.

The insulating films 12A and 12B, the gate electrode 13, the interlayer insulating film 14, and the microlens 15 are configured in a similar fashion to the first embodiment.

The first to third metal wiring layers 43 to 45 and the insulating films 22C to 22E are configured in a similar fashion to the second embodiment. It is to be noted that the number of laminated metal wiring layers and configurations of the metal wiring layers are not specifically limited.

As with the first embodiment, the reflective plate 21 is configured to reflect the light L1 having passed through the first member 10 to return the light L1 to the photoelectric conversion section 11, thereby improving sensitivity. In particular, in this embodiment, the reflective plate 21 reflects a component having passed through the photoelectric conversion sections 11 of red light with a long wavelength, and allows the reflected component to enter the photoelectric conversion section 11 in a third layer located farthest from the light incident surface 10A again. As described in the sixth embodiment, to enhance sensitivity, it is highly effective to provide the reflective plate 21 made of copper with high reflectivity with respect to long-wavelength light to the photoelectric conversion section 11 in the lower layer when viewed from the light incident surface 10A.

As with the first embodiment, the reflective plate 21 may preferably have the concave surface section 21A in the top surface thereof (on the side closer to the photoelectric conversion section 11) and the flat section 21B in the bottom surface thereof. As with the second embodiment, the concave surface section 21A is formed by dishing the metal material film 25C embedded in the groove section 24D of the insulating film 22D by a chemical mechanical polishing method. As with the first embodiment, the reflective plate 21 may be preferably made of, for example, one or more kinds selected from a group configured of copper, aluminum, alloys including copper, and alloys including aluminum.

As with the second embodiment, the reflective plate 21 may be preferably configured of a same metal material film as a metal material film configuring the second metal wiring layer 44, because the reflective plate 21 and the second metal wiring layer 44 are allowed to be fabricated by a same process.

In this solid-state image pickup unit 1F, when the light L1 enters the photoelectric conversion sections 11 through the microlens 15, the light L1 passes through the three photoelectric conversion sections 11, and each of red light, green light and blue light is photoelectrically converted during passage therethrough. A signal corresponding to the blue wavelength region is obtained from the photoelectric conversion section 11 in a first layer located closest to the light incident surface 10A. A signal corresponding to the green wavelength region is obtained from the photoelectric conversion section 11 in a second layer located second closest to the light incident surface 10A. A signal corresponding to the red wavelength region is obtained from the photoelectric conversion section 11 in a third layer located farthest from the light incident surface 10A.

In this case, since the second member 20 including the reflective plate 21 with the concave surface section 21A is bonded to the surface opposite to the light incident surface 10A of the first member 10, the light L1 having passed through the photoelectric conversion sections 11 is reflected by the concave surface section 21A of the reflective plate 21, and reflected light L2 enters the photoelectric conversion sections 11 again, thereby reducing crosstalk to adjacent pixels. In particular, in this embodiment, a component having passed through the photoelectric conversion sections 11 of red light with a long wavelength is reflected by the reflective plate 21, and enters the photoelectric conversion section 11 located farthest from the light incident surface 10A again. Therefore, sensitivity to red is particularly improved.

This solid-state image pickup unit 1F may be manufactured in a similar fashion to the second embodiment, except that the three photoelectric conversion sections 11 are laminated for each pixel in the first member 10.

Eighth Embodiment

FIG. 42 illustrates a sectional configuration of a solid-state image pickup unit 1G according to an eighth embodiment of the present disclosure. In this embodiment, as the photoelectric conversion section 11, an inorganic photoelectric conversion section 11A and an organic photoelectric conversion section 11B are included. The solid-state image pickup unit 1G has a configuration, functions, and effects similar to those in the above-described second embodiment, except for this point. Therefore, like components will be described with like reference numerals.

As with the first embodiment, the solid-state image pickup unit 1G includes the first member 10 including the photoelectric conversion section 11 and the second member including the reflective plate 21 with the concave surface section 21A. As with the first embodiment, the second member 20 is bonded to the surface opposite to the light incident surface 10A of the first member 10 so as to allow the concave surface section 21A of the reflective plate 21 to face the photoelectric conversion section 11. Thus, as with the first embodiment, the solid-state image pickup unit 1G is allowed to include the concave reflective plate 21 that has high shape uniformity and is capable of being fabricated by a simple process.

The first member 10 may include, for example, the insulating films 12A and 12B, the gate electrode 13, and the third metal wiring layer 45 below the inorganic photoelectric conversion section 11A in this order from a side closer to the inorganic photoelectric conversion section 11A. The organic photoelectric conversion section 11B, a passivation film 18, and the microlens 15 are disposed above the inorganic photoelectric conversion section 11A with the interlayer insulating film 14 in between.

The second member 20 may include, for example, the insulating film 22C, the first metal wiring layer 43, the insulating film 22D, the reflective plate 21, the second metal wiring layer 44, and the insulating film 22E in this order on the silicon substrate 23.

As described above, the photoelectric conversion section 11 includes the inorganic photoelectric conversion section 11A and the organic photoelectric conversion section 11B. The inorganic photoelectric conversion section 11A is configured in a similar fashion to the photoelectric conversion section 11 in the first embodiment. For example, two inorganic photoelectric conversion sections 11A may be laminated for each pixel in a similar fashion to the sixth embodiment. It is to be noted that one inorganic photoelectric conversion section 11A may be included for each pixel in a similar fashion to the first embodiment.

The organic photoelectric conversion section 11B may include, for example, an organic film (a photoelectric conversion film) 83 between a lower transparent electrode (pixel electrode) 81 and an upper transparent electrode (counter electrode) 82.

The lower transparent electrode 81 is partitioned into sections corresponding to a plurality of pixels, and the sections are insulated from one another by an insulating film 84. The lower transparent electrode 81 is connected to a metal wiring layer (not illustrated) through wiring (not illustrated). The upper transparent electrode 82 serves as a common electrode common to the plurality of pixels. The lower transparent electrode 81 and the upper transparent electrode 82 may be made of, for example, a transparent conductive material such as ITO (Indium Tin Oxide).

The organic film 83 is configured of an organic photoelectric conversion film. The organic photoelectric conversion film configured to perform photoelectric conversion for green wavelength light may be made of, for example, an organic photoelectric conversion material including a rhodamine-based pigment, a merocyanine-based pigment, quinacridone, or the like. The organic photoelectric conversion film configured to perform photoelectric conversion for red wavelength light may be made of, for example, an organic photoelectric conversion material including a phthalocyanine-based pigment. The organic photoelectric conversion film configured to perform photoelectric conversion for blue wavelength light may be made of, for example, an organic photoelectric conversion material including a coumarin-based pigment, tris-(8-hydroxyquinoline)aluminum ($Alq_3$), a merocyanine-based pigment, or the like.

The passivation film 18 has a function as a protective film configured to inhibit entry of water or gas into the organic photoelectric conversion section 11B, and may be preferably configured of a material film not allowing water and oxygen to pass therethrough. The passivation film 18 may be configured of, for example, a silicon nitride film, a silicon oxide nitride film, an aluminum oxide film, or a laminate film thereof.

The insulating films 12A and 12B, the gate electrode 13, the interlayer insulating film 14, and the microlens 15 are configured in a similar fashion to the first embodiment.

The first to third metal wiring layers 43 to 45 and the insulating films 22C to 22E are configured in a similar fashion to the second embodiment. It is to be noted that the number of laminated metal wiring layers and configurations of the metal wiring layers are not specifically limited.

As with the first embodiment, the reflective plate 21 may preferably have the concave surface section 21A in the top surface thereof (on the side closer to the photoelectric conversion section 11) and the flat section 21B in the bottom surface thereof. As with the second embodiment, the concave surface section 21A is formed by dishing the metal material film 25C embedded in the groove section 24D of the insulating film 22D by a chemical mechanical polishing method. As with the first embodiment, the reflective plate 21 may be preferably made of, for example, one or more kinds selected from a group configured of copper, aluminum, alloys including copper, and alloys including aluminum.

As with the second embodiment, the reflective plate 21 may be preferably configured of a same metal material film as a metal material film configuring the second metal wiring layer 44, because the reflective plate 21 and the second metal wiring layer 44 are allowed to be fabricated by a same process.

In this solid-state image pickup unit 1G, when the light L1 enters the photoelectric conversion section 11 through the microlens 15, the light L1 passes through the organic photoelectric conversion section 11B and the two inorganic photoelectric conversion sections 11A, and each of red light, green light and blue light is photoelectrically converted during passage therethrough. A signal corresponding to the green wavelength region is obtained from the organic photoelectric conversion section 11B. A signal corresponding to the blue wavelength region is obtained from the inorganic photoelectric conversion section 11A located closer to the light incident surface 10A. A signal corresponding to the red wavelength region is obtained from the inorganic photoelectric conversion section 11A located farther from the light incident surface 10A.

In this case, since the second member 20 including the reflective plate 21 with the concave surface section 21A is bonded to the surface opposite to the light incident surface 10A of the first member 10, the light L1 having passed through the photoelectric conversion section 11 is reflected by the concave surface section 21A of the reflective plate 21, and reflected light L2 enters the photoelectric conversion section 11 again, thereby reducing crosstalk to adjacent pixels. In particular, in this embodiment, a component having passed through the inorganic photoelectric conversion sections 11A of red light with a long wavelength is reflected by the reflective plate 21, and enters the inorganic photoelectric conversion section 11A located farther from the light incident surface 10A again. Therefore, sensitivity to red is particularly improved.

This solid-state image pickup unit 1G may be manufactured in a similar fashion to the second embodiment, except that the microlens 15 is disposed after the organic photoelectric conversion section 11B is formed on the interlayer insulating film 14.

Application Example 1

FIG. 43 illustrates an appearance of a digital still camera according to Application Example 1 of any of the embodiments of the present disclosure when viewed from a subject. A digital still camera 101 includes an open-close panel 103 that is slidable along an up-down direction on a front surface of a main section 102. An operation section 104 is disposed on a top surface of the main section 102. The operation section 104 may include, for example, a power button for power on, a shutter button that is operated during shooting, and a zoom knob for zooming.

In the following description and drawings, a front-back direction (Z), an up-down direction (Y), and a right-left direction (X) correspond to directions when viewed from a user during shooting with use of the digital still camera 101. Therefore, a subject side corresponds to a front side, and the user side corresponds to a back side. It is to be noted that the front-back direction (Z), the up-down direction (Y), and the right-left direction (X) are used for the convenience of description, and directions in implementing the present disclosure are not limited thereto.

The main section 102 may include, for example, a front panel 102A, an intermediate frame 102B, and a cabinet 102C. The front panel 102A, the intermediate frame 102B, and the cabinet 102C are combined together in order along the front-back direction Z.

FIG. 44 illustrates a state in which the open-close panel 103 is opened. A flash 105 configured to apply auxiliary light during shooting, and a taking lens 106 configured to form an image of a subject are arranged along the right-left direction. A lens or a lens group (not illustrated) as an image pickup optical system (not illustrated in FIG. 44, refer to FIG. 46) is arranged along an optical axis behind the taking lens 106 in the main section 102.

The flash 105 and the taking lens 106 are opened and closed by sliding the open-close panel along the up-down direction. When the open-close panel 103 is moved downward to open the flash 105 and the taking lens 106, a photograph of a subject is allowed to be taken. When the open-close panel 103 is moved upward to close the flash 105 and the taking lens 106, a photograph of a subject is not allowed to be taken.

FIG. 45 illustrates an appearance of the digital still camera 101 when viewed from the user side. A display unit 107 is disposed on a back surface of the main section 102. The display unit 107 is configured to display an image of a subject formed by the image pickup optical system or an image picked up by an image pickup device. Moreover, the display unit 107 displays an operation state of the operation section 104 by the user, and various kinds of data and the like stored in an internal memory in the main section 102 or an external memory. The display unit 107 may be configured of, for example, a liquid crystal, an organic EL, or the like.

FIG. 46 illustrates an example of a circuit configuration of the digital still camera 101. The digital still camera 101 may include, for example, a camera block 120 having an image pickup function, a camera signal processing section 121, an image processing section 122, the display unit 107, an R/W (reader/writer) 123, a CPU (Central Processing Unit) 124, an input section 125, and a lens drive control section 126.

The camera block 120 may include, for example, an image pickup device 128 following an image pickup optical system 127 including a lens group (not illustrated) or the like. The image pickup device 128 is configured of any one of the solid-state image pickup units 1 to 1G according to the above-described embodiments of the present disclosure.

The camera signal processing section 121 may be configured to perform, for example, various kinds of signal processing such as analog-to-digital conversion of an output signal from the image pickup device 128, noise removal, image quality correction, and conversion into a luminance-color-difference signal.

The image processing section 122 is configured to perform compression coding and expansion decoding of an image signal, based on a predetermined image data format, conversion of data specifications such as resolution, and the like.

The R/W 123 is configured to perform writing of image data encoded by the image processing section 122 to a memory card 123A and reading of image data stored in the memory card 123A. The memory card 123A may be, for example, a semiconductor memory removable from a slot connected to the R/W 123.

The CPU 124 has a function as a control processing section configured to control the entire digital still camera 101, and controls respective circuit blocks, based on an instruction input signal from the input section 125, or the like.

The input section 125 is configured to output an instruction input signal corresponding to an operation of the operation section 104 by the user to the CPU 124.

The lens drive control section 126 is configured to control a motor (not illustrated) or the like driving each lens of the image pickup optical system 127, based on a control signal from the CPU 124.

Application Example 2

FIGS. 47 and 49 each illustrate an appearance of a smartphone to which any one of the solid-state image pickup units 1 to 1G according to the above-described embodiments is applied. The smartphone 220 may include, for example, a display section 221 and an operation section 222 on a front side, and a lens 223 for shooting of an image of a subject on a back side. As with Application Example 1, an image pickup device (not illustrated) is disposed following an image pickup optical system (not illustrated) including the lens 223 in the smartphone 220. The image pickup device is configured of any one of the solid-state image pickup units 1 to 1G according to the above-described embodiments.

Application Example 3

FIG. 49 illustrates an appearance of a video camera 260 to which any one of the solid-state image pickup units 1 to 1G according to the above-described embodiments is applied. The video camera 260 may include, for example, a main section 261, a lens 262 provided on a front surface of the main section 261 and for shooting an image of an object, a shooting start and stop switch 263, and a display section 264. As with Application Example 1, an image pickup device (not illustrated) is disposed following an image pickup optical system (not illustrated) including the lens 262 in the main section 261. The pickup device is configured of any one of the solid-state image pickup units 1 to 1G according to the above-described embodiments.

Application Example 4

FIGS. 50 and 51 each illustrate an appearance of a cellular phone 270 to which any one of the solid-state image pickup units 1 to 1G according to the above-described embodiments is applied. The cellular phone 270 may be configured, for example, by connecting a top-side enclosure 271 and a bottom-side enclosure 272 to each other through a connection section (hinge section) 273, and the cellular phone 270 may include a display 274, a sub-display 275, a picture light 27, and a lens 277 for shooting of an image of a subject. In the top-side enclosure 271 or the bottom-side enclosure 272, as with Application Example 1, an image pickup device (not illustrated) is disposed following an image pickup optical system (not illustrated) including the lens 277. The image pickup device is configured of any one of the solid-state image pickup units 1 to 1G according to the above-described embodiments.

Although the present disclosure is described referring to the above-described embodiments, the disclosure is not limited thereto, and may be variously modified.

For example, in the above-described eighth embodiment, a case where the lower transparent electrode 81 is partitioned into sections corresponding to respective pixels, and the upper transparent electrode 82 serves as a common electrode is described; however, the upper transparent electrode 82 may be partitioned into sections corresponding to respective pixels, and the lower transparent electrode 81 may serve as a common electrode. In this case, a signal charge photoelectrically converted is collected to the upper transparent electrode 82, and is output to an external component through a charge output section (not illustrated) connected to the upper transparent electrode 82.

Moreover, for example, in the above-described embodiments, configurations of the solid-state image pickup units 1 to 1G are specifically described; however, it is not necessary to include all of the components, and any other component may be further included.

It is to be noted that the present disclosure may have the following configurations.

(1) A solid-state image pickup unit including:
a first member including a photoelectric conversion section; and
a second member including a reflective plate with a concave surface section, the second member being bonded to a surface of the first member to allow the concave surface section of the reflective plate to face the photoelectric conversion section.

(2) The solid-state image pickup unit according to (1), in which the surface of the first member is opposite to a light incident surface.

(3) The solid-state image pickup unit according to (1), in which the reflective plate has the concave surface section in a top surface thereof and a flat section in a bottom surface thereof.

(4) The solid-state image pickup unit according to (1), in which the concave surface section is formed by dishing a metal material film embedded in a groove section of an insulating film.

(5) The solid-state image pickup unit according to (1), in which the concave surface section is formed by a chemical mechanical polishing method.

(6) The solid-state image pickup unit according to (1), in which the reflective plate is made of at least one material selected from a group configured of copper, aluminum, alloys including copper, and alloys including aluminum.

(7) The solid-state image pickup unit according to (1), further including a metal wiring layer configured to perform at least one of driving of the photoelectric conversion section or signal transmission, in which a part of the metal wiring layer is disposed in the second member.

(8) The solid-state image pickup unit according to (7), in which the reflective plate and the portion of the metal wiring layer are configured of a same metal material film.

(9) The solid-state image pickup unit according to (1), further including a peripheral circuit of the photoelectric conversion section, in which the peripheral circuit is mounted in the second member.

(10) The solid-state image pickup unit according to (9), in which the peripheral circuit is configured of at least one of a drive circuit of the photoelectric conversion section, an output circuit of the photoelectric conversion section, a signal processing circuit, and a memory circuit configured to hold signals.

(11) The solid-state image pickup unit according to (1), in which the first member includes: a green filter; a red filter; and a blue filter; and the second member includes: a connection section in a region facing the blue filter, the connection section being configured to electrically connect the first member to the second member.

(12) The solid-state image pickup unit according to (2), in which the first member includes:
a green filter and a magenta filter;
two photoelectric conversion sections laminated in a direction perpendicular to the light incident surface in a region facing the green filter; and two photoelectric conversion sections laminated in the direction perpendicular to the light incident surface in a region facing the magenta filter.

(13) The solid-state image pickup unit according to (2), in which the first member includes: a plurality of photoelectric conversion sections laminated in a direction perpendicular to the light incident surface.

(14) The solid-state image pickup unit according to (1), in which the first member includes: an inorganic photoelectric conversion section and an organic photoelectric conversion section.

(15) A method of manufacturing a solid-state image pickup unit, the method including: forming a photoelectric conversion section on a first semiconductor substrate to form a first member;
forming a reflective plate with a concave surface section on a second semiconductor substrate to form a second member; and
bonding the second member to a surface of the first member to allow the concave surface section of the reflective plate to face the photoelectric conversion section.

(16) The method of manufacturing the solid-state image pickup unit according to (15), in which the forming of the reflective plate includes:
forming an insulating film on the second semiconductor substrate;
providing a groove section to the insulating film;
forming a metal material film on a top surface of the insulating film and in the groove section; and forming the concave surface section by polishing the metal material film by a chemical mechanical polishing method and removing the metal material film other than a portion embedded in the groove section of the metal material film to form the reflective plate, and dishing a top surface of the reflective plate.

(17) The method of manufacturing the solid-state image pickup unit according to (15), the method further including:
forming a metal wiring layer configured to perform of driving of the photoelectric conversion section and signal transmission,
in which a part of the metal wiring layer is formed in the second member.

(18) The method of manufacturing the solid-state image pickup unit according to (15), in which the metal wiring layer is formed in each of the first member and the second member,
the method further includes, before bonding the second member to the first member:
exposing the metal wiring layer formed in the first member; and
exposing the metal wiring layer formed in the second member.

(19) The method of manufacturing the solid-state image pickup unit according to (15), the method further including:
forming an on-chip lens on a light incident surface of the first member, wherein the surface of the first member is opposite to the light incident surface, wherein the second member is bonded such that light having passed through the on-chip lens and through the photoelectric conversion section a first time is reflected by the concave surface section to enter the photoelectric conversion section a second time.

(20) An electronic apparatus provided with a solid-state image pickup unit, the solid-state image pickup unit including:
a first member including a photoelectric conversion section; and a second member including a reflective plate with a concave surface section, the second member being bonded to a surface of the first member to allow the concave surface section of the reflective plate to face the photoelectric conversion section.

It should be understood by those skilled in the art that various modifications, combinations, sub-combinations, and alterations may occur depending on design requirements and other factors insofar as they are within the scope of the appended claims or the equivalents thereof.

REFERENCE SINGS LIST 1, 1A to 1G solid-state image pickup unit
10 first member
11 photoelectric conversion section
11A inorganic photoelectric conversion section
11B organic photoelectric conversion section
12A, 12B insulating film
13 gate electrode
14 interlayer insulating film
15 microlens
16 silicon substrate
17 semiconductor layer
18 passivation film
20 second member
21 reflective plate
21A concave surface section
21B flat section
22A to 22E insulating film
23 silicon substrate
24A to 24D groove section
25A to 25C metal material film
30 bonding interface
41 to 45 metal wiring layer
46 via
50 transistor
51 gate electrode
52 gate insulating film
53 source
54 drain
60 connection section
61 first through hole via
62 second through hole via
63 metal film
70R red filter
70G green filter
70B blue filter
70M magenta filter
81 lower transparent electrode
82 upper transparent electrode
83 organic film
101 digital still camera

What is claimed is:

1. A solid-state image pickup unit, comprising:
a first member, including:
  a photoelectric conversion section;
  a green filter;
  a red filter; and
  a blue filter; and
a second member, including:
  a reflective plate with a concave surface section on a top surface thereof and a flat surface section on a bottom surface thereof;
  a peripheral circuit of the photoelectric conversion section, wherein the peripheral circuit includes a plurality of transistors and wherein the peripheral circuit is provided beneath the reflective plate such that the flat surface section of the reflective plate is provided between the concave surface section of the reflective plate and the peripheral circuit; and
  a connection section,
    wherein the second member is bonded to a surface of the first member such that the concave surface section of the reflective plate faces the photoelectric conversion section,
    wherein the connection section is only in a region facing the blue filter and substantially overlaps a length of the blue filter in a horizontal direction in a cross-sectional view,
    wherein in the region facing the blue filter, the photoelectric conversion section is positioned between the blue filter and the connection section and centers of the photoelectric conversion section, the blue filter and the connection section are aligned with each other,
    wherein the connection section is configured to electrically connect the first member to the second member,
    wherein the connection section includes a first part and a second part separated from the first part by an insulating film,
    wherein a surface of the first part forms a first portion of a bonding interface with the second member,
    wherein a surface of the second part forms a second portion of the bonding interface with the second member,
    wherein a first line that is perpendicular to the surface of the first part that forms the first portion of the bonding interface with the second member and that intersects the first part and the photoelectric conversion section also intersects the blue filter,
    wherein a second line that is perpendicular to the surface of the second part that forms the second portion of the bonding interface with the second member and that intersects the second part and the photoelectric conversion section also intersects the blue filter, and
    wherein the reflective plate is not in the region facing the blue filter.

2. The solid-state image pickup unit according to claim 1, wherein the surface of the first member is opposite to a light incident surface.

3. The solid-state image pickup unit according to claim 1, wherein the concave surface section is formed by dishing a metal material film embedded in a groove section of an insulating film.

4. The solid-state image pickup unit according to claim 1, wherein the concave surface section is formed by a chemical mechanical polishing method.

5. The solid-state image pickup unit according to claim 1, wherein the reflective plate is made of at least one material selected from the group consisting of copper, aluminum, alloys including copper, and alloys including aluminum.

6. The solid-state image pickup unit according to claim 1, wherein the first part and the second part are included in a metal wiring layer configured to perform at least one of driving of the photoelectric conversion section and signal transmission.

7. The solid-state image pickup unit according to claim 6, wherein the reflective plate and at least a portion of the metal wiring layer are configured of a same metal material film.

8. The solid-state image pickup unit according to claim 1, wherein the peripheral circuit is configured of at least one of a drive circuit of the photoelectric conversion section, an output circuit of the photoelectric conversion section, a signal processing circuit, and a memory circuit configured to hold signals.

9. The solid-state image pickup unit according to claim 1, wherein the first member includes: an inorganic photoelectric conversion section and an organic photoelectric conversion section.

10. The solid-state image pickup unit according to claim 1, wherein the first member further includes a first metal wiring and a second metal wiring, wherein the first metal wiring of the first member is in direct contact with at least a portion of the surface of the first part, wherein the second metal wiring of the first member is in direct contact with at least a portion of the surface of the second part.

11. The solid-state image pickup unit according to claim 10, wherein the first line also intersects the first metal wiring of the first member, and wherein the second line also intersects the second metal wiring of the first member.

12. A method of manufacturing a solid-state image pickup unit, the method comprising:
    forming a photoelectric conversion section on a first semiconductor substrate to form a first member, wherein the first member includes a green filter, a red filter, and a blue filter;
    forming a reflective plate with a concave surface section on a top surface thereof and a flat surface section on a bottom surface thereof on a second semiconductor substrate to form a second member, wherein the second member includes a connection section and a peripheral circuit, wherein the peripheral circuit includes a plurality of transistors, and wherein the peripheral circuit is provided beneath the reflective plate such that the flat surface section of the reflective plate is provided between the concave surface section of the reflective plate and the peripheral circuit; and
    bonding the second member to a surface of the first member with the concave surface section of the reflective plate facing the photoelectric conversion section,
    wherein the connection section is only in a region facing the blue filter and substantially overlaps a length of the blue filter in a horizontal direction in a cross-sectional view,
    wherein in the region facing the blue filter, the photoelectric conversion section is positioned between the blue filter and the connection section and centers of the photoelectric conversion section, the blue filter and the connection section are aligned with each other,
    wherein the connection section is configured to electrically connect the first member to the second member, and wherein the connection section includes a first part and a second part, and
    forming a separation between the first part and the second part within the connection section with an insulating film,
    wherein a surface of the second part forms a second portion of the bonding interface with the second member,
    wherein a surface of the second part forms a second portion of the bonding interface with the second member,
    wherein a first line that is perpendicular to the surface of the first part that forms the first portion of the bonding interface with the second member and that intersects the first part and the photoelectric conversion section also intersects the blue filter,
    wherein a second line that is perpendicular to the surface of the second part that forms the second portion of the bonding interface with the second member and that intersects the second part and the photoelectric conversion section also intersects the blue filter,
    wherein the reflective plate is not in the region facing the blue filter.

13. The method of manufacturing the solid-state image pickup unit according to claim 12, wherein the forming of the reflective plate includes:
    forming an insulating film on the second semiconductor substrate;
    providing a groove section to the insulating film;
    forming a metal material film on a top surface of the insulating film and in the groove section; and
    forming the concave surface section by polishing the metal material film by a chemical mechanical polishing method and removing the metal material film other than a portion embedded in the groove section of the metal material film to form the reflective plate, and dishing a top surface of the reflective plate.

14. The method of manufacturing the solid-state image pickup unit according to claim 12, the method further comprising:
    forming a metal wiring layer wherein the first part and the second part are included,
    wherein the metal wiring layer is configured to perform at least one of driving of the photoelectric conversion section and signal transmission,
    wherein a part of the metal wiring layer is formed in the second member.

15. The method of manufacturing the solid-state image pickup unit according to claim 12, wherein the metal wiring layer is formed in each of the first member and the second member,
    wherein the first part and the second part are included in the second member,
        the method further comprises, before bonding the second member to the first member:
        exposing the metal wiring layer formed in the first member; and
        exposing the metal wiring layer formed in the second member.

16. The method of manufacturing the solid-state image pickup unit according to claim 12, the method further comprising:
    forming an on-chip lens on a light incident surface of the first member, wherein the surface of the first member is opposite to the light incident surface, wherein the second member is bonded such that light having passed through the on-chip lens and through the photoelectric conversion section a first time is reflected by the concave surface section to enter the photoelectric conversion section a second time.

17. An electronic apparatus provided with a solid-state image pickup unit, the solid-state image pickup unit comprising:
    a first member, including:
        a photoelectric conversion section;
        a green filter;
        a red filter; and
        a blue filter; and
    a second member, including:
        a reflective plate with a concave surface section on a top surface thereof and flat surface section on a bottom surface thereof;
        a peripheral circuit of the photoelectric conversion section, wherein the peripheral circuit includes a plurality of transistors and wherein the peripheral circuit is provided beneath the reflective plate such that the flat surface section of the reflective plate is provided between the concave surface section of the reflective plate and the peripheral circuit; and a connection section, wherein the second member is bonded to a surface of the first member such that the concave surface section of the reflective plate faces the photoelectric conversion section, wherein the connection section is only in a region facing the blue filter and substantially overlaps a length of the blue filter in a horizontal direction in a cross-sectional view, wherein in the region facing the blue filter, the photoelectric conversion section is positioned between the blue filter and the connection section and centers of the photoelectric conversion section, the blue filter and the connection section are aligned with each other, wherein the connection section is configured to electrically connect the first member to the second member, wherein the connection section includes a first part and a second part separated from the first part by an insulating film, wherein a surface of the first part forms a first portion of a bonding interface with the second member, wherein a surface of the second part forms a second portion of the bonding interface with the second member, wherein a first line that is perpendicular to a surface of the first part that forms the first portion of the bonding interface with the second member that intersects the first part and the photoelectric conversion section also intersects the blue filter, wherein a second line that is perpendicular to the surface of the second part that forms the second portion of the bonding interface with the second member and that intersects the second part and the photoelectric conversion section also intersects the blue filter, and wherein the reflective plate is not in the region facing the blue filter.

\* \* \* \* \*